(12) United States Patent
Yamada et al.

(10) Patent No.: US 10,288,245 B2
(45) Date of Patent: May 14, 2019

(54) HEADLIGHT WITH ILLUMINATION DEVICE HAVING ROTATABLE TRANSMISSIVE ELEMENT FOR SHIFTING LIGHT CONCENTRATION POSITION

(71) Applicant: MITSUBISHI ELECTRIC CORPORATION, Tokyo (JP)

(72) Inventors: Akihiro Yamada, Tokyo (JP); Masatoshi Nishimura, Tokyo (JP); Jun Kondo, Tokyo (JP)

(73) Assignee: MITSUBISHI ELECTRONIC CORPORATION, Tokyo (JP)

( * ) Notice: Subject to any disclaimer, the term of this patent is extended or adjusted under 35 U.S.C. 154(b) by 0 days.

(21) Appl. No.: 15/560,727

(22) PCT Filed: Jun. 14, 2016

(86) PCT No.: PCT/JP2016/067634
§ 371 (c)(1),
(2) Date: Sep. 22, 2017

(87) PCT Pub. No.: WO2016/204139
PCT Pub. Date: Dec. 22, 2016

(65) Prior Publication Data
US 2018/0051857 A1    Feb. 22, 2018

(30) Foreign Application Priority Data

Jun. 16, 2015  (JP) .................. 2015-121029

(51) Int. Cl.
*F21V 14/06* (2006.01)
*F21S 41/20* (2018.01)
(Continued)

(52) U.S. Cl.
CPC .............. *F21S 41/285* (2018.01); *F21K 9/64* (2016.08); *F21S 41/125* (2018.01);
(Continued)

(58) Field of Classification Search
CPC ..... F21V 9/35; F21V 9/38; F21V 9/30; F21V 9/32; F21V 9/45; F21V 14/06
See application file for complete search history.

(56) References Cited

U.S. PATENT DOCUMENTS 5,938,319 A * 8/1999 Hege .................. B60Q 1/00
                                                            362/459
6,798,575 B2 * 9/2004 Kobayashi ........... G02B 26/101
                                                            348/E9.026
(Continued)

FOREIGN PATENT DOCUMENTS

JP    11-6603 A      3/1999
JP    2006-113297 A  4/2006
(Continued)

OTHER PUBLICATIONS

Office Action dated Apr. 3, 2018 in counterpart Japanese Application No. 2017-077230 with an English Translation.
(Continued)

*Primary Examiner* — Ismael Negron
(74) *Attorney, Agent, or Firm* — Birch, Stewart, Kolasch & Birch, LLP

(57) ABSTRACT

An illumination device includes a light source; a light condensing element for concentrating light from the light source onto a light concentration position; a plate for receiving light from the light condensing element and transmitting such light; a phosphor element for receiving light from the light source at the light concentration position; and a lens for projecting light from the plate. The plate is configured to rotate about an axis perpendicular to an optical axis of the lens to shift the light concentration position, which is between the plate and the lens, in a direction perpendicular to the optical axis of the lens.

10 Claims, 17 Drawing Sheets

(51) Int. Cl.

| | | |
|---|---|---|
| *F21K 9/64* | (2016.01) | |
| *F21S 41/675* | (2018.01) | |
| *F21S 41/25* | (2018.01) | |
| *F21S 41/125* | (2018.01) | |
| *F21S 41/141* | (2018.01) | |
| *G02B 27/30* | (2006.01) | |
| *F21S 41/63* | (2018.01) | |
| *F21S 41/16* | (2018.01) | |
| *F21S 41/176* | (2018.01) | |
| *H01S 5/00* | (2006.01) | |
| *F21Y 113/13* | (2016.01) | |
| *F21Y 115/10* | (2016.01) | |
| *F21S 41/255* | (2018.01) | |
| *H01S 5/323* | (2006.01) | |

(52) U.S. Cl.
CPC ............ *F21S 41/141* (2018.01); *F21S 41/16* (2018.01); *F21S 41/176* (2018.01); *F21S 41/25* (2018.01); *F21S 41/635* (2018.01); *F21S 41/675* (2018.01); *G02B 27/30* (2013.01); *H01S 5/005* (2013.01); *F21S 41/255* (2018.01); *F21Y 2113/13* (2016.08); *F21Y 2115/10* (2016.08); *H01S 5/0071* (2013.01); *H01S 5/32341* (2013.01)

(56) References Cited

U.S. PATENT DOCUMENTS

| | | | | |
|---|---|---|---|---|
| 8,496,352 | B2 * | 7/2013 | Bartlett | ................ G03B 21/204 |
| | | | | 362/231 |
| 8,708,537 | B2 * | 4/2014 | Takahashi | ............... F21V 13/00 |
| | | | | 362/509 |
| 9,441,812 | B2 * | 9/2016 | Liao | .......................... F21V 9/40 |
| 9,458,977 | B2 * | 10/2016 | Sugiyama | .......... G02B 26/0858 |
| 9,897,283 | B2 * | 2/2018 | Schwaiger | ................ F21V 9/08 |
| 10,047,918 | B2 * | 8/2018 | Su | .............................. F21K 9/64 |
| 2005/0110954 | A1 * | 5/2005 | Kojima | ................ H04N 9/3135 |
| | | | | 353/31 |
| 2009/0086500 | A1 | 4/2009 | Tatara et al. | |
| 2010/0053565 | A1 | 3/2010 | Mizushima et al. | |
| 2012/0051074 | A1 | 3/2012 | Takahashi | |
| 2013/0038847 | A1 | 2/2013 | Katou | |
| 2014/0016322 | A1 * | 1/2014 | Lu | ........................... F21V 14/04 |
| | | | | 362/282 |
| 2014/0029282 | A1 * | 1/2014 | Ravier | .................... F21S 41/14 |
| | | | | 362/510 |
| 2015/0049457 | A1 * | 2/2015 | Kroell | ................ G01N 21/8806 |
| | | | | 362/84 |
| 2015/0176811 | A1 * | 6/2015 | Schwaiger | ................ F21K 9/64 |
| | | | | 362/84 |

FOREIGN PATENT DOCUMENTS

| | | |
|---|---|---|
| JP | 2007-52957 A | 3/2007 |
| JP | 2009-87811 A | 4/2009 |
| JP | 2009-199854 A | 9/2009 |
| JP | 2009-224039 A | 10/2009 |
| JP | 2009-266437 A | 11/2009 |
| JP | 2010-85740 A | 4/2010 |
| JP | 2011-142000 A | 7/2011 |
| JP | 2012-37724 A | 2/2012 |
| JP | 2012-74354 A | 4/2012 |
| JP | 2012-221634 A | 11/2012 |
| JP | 2015-15128 A | 1/2015 |
| JP | 2015513187 A | 4/2015 |
| JP | 2015-92280 A | 5/2015 |
| WO | WO 2008/114502 A1 | 9/2008 |
| WO | WO 2009/131126 A1 | 10/2009 |
| WO | WO 2011/145207 A1 | 11/2011 |
| WO | WO 2013/132394 A1 | 9/2013 |

OTHER PUBLICATIONS

Office Action dated Jan. 23, 2018 in counterpart Japanese Patent Application No. 2017-077230 with an English Machine Translation.

* cited by examiner

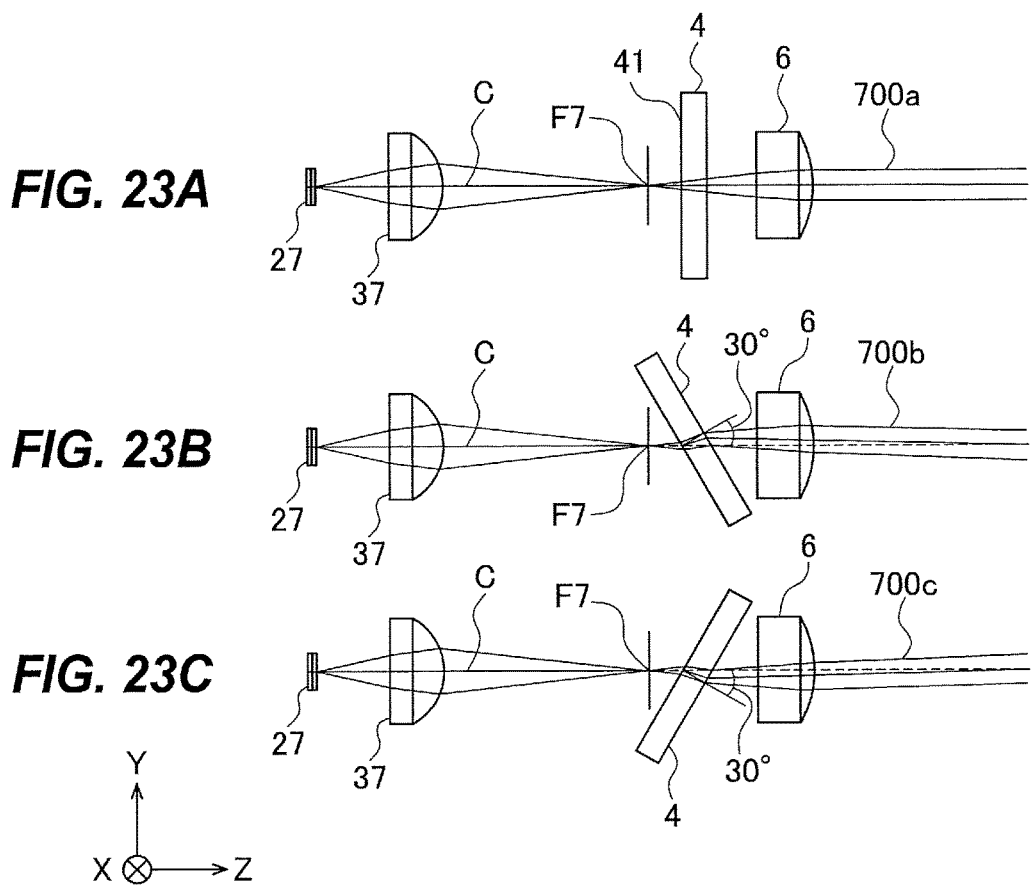
FIG. 23A
FIG. 23B
FIG. 23C
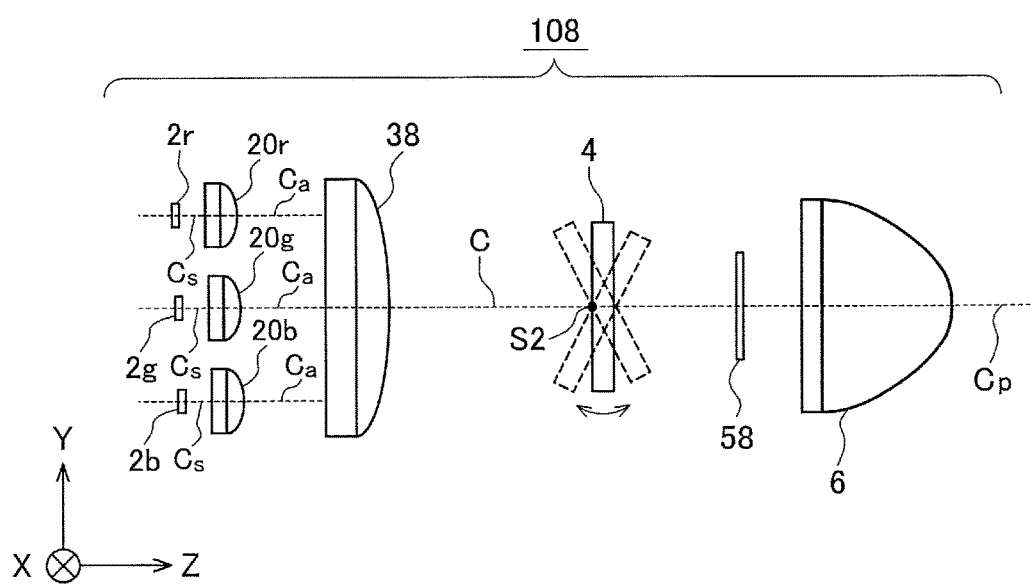
FIG. 24

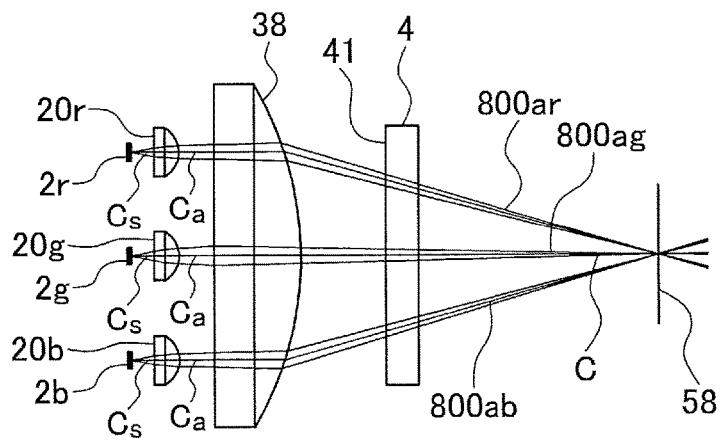
FIG. 25A
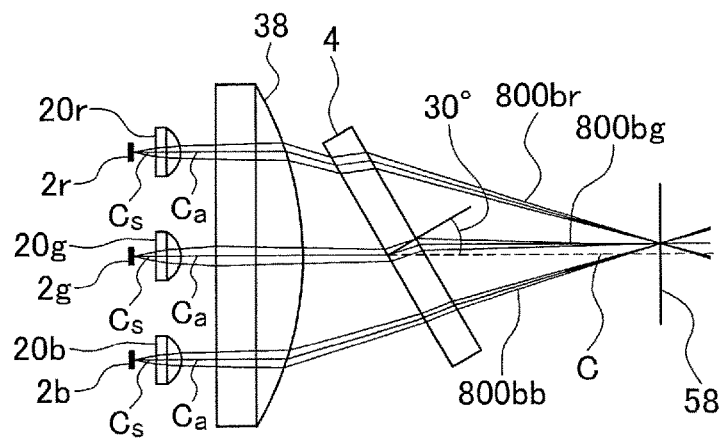
FIG. 25B
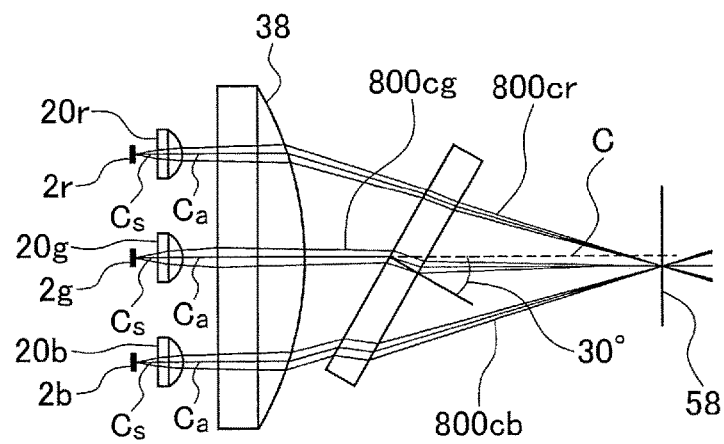
FIG. 25C
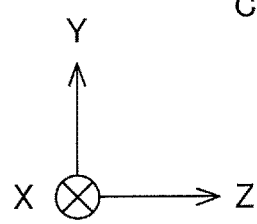

US 10,288,245 B2

HEADLIGHT WITH ILLUMINATION DEVICE HAVING ROTATABLE TRANSMISSIVE ELEMENT FOR SHIFTING LIGHT CONCENTRATION POSITION

TECHNICAL FIELD

The present invention relates to a headlight device and an illumination device that use a light source and an optical element.

BACKGROUND ART

In recent years, there has been an increasing demand for a headlight device capable of changing a light distribution pattern including an irradiation direction depending on the driving condition of a vehicle.

There are similar demands for illumination devices. For example, in exhibition of merchandise or the like, the exhibition effect is improved by changing the color of light illuminating the merchandise, the spot size or illumination position of illumination light, or the like.

For downlights (illumination devices) installed in shops or other places, it is common to manually change the irradiation directions. Thus, to improve convenience, capability of automatically changing the irradiation direction is required.

As such, an illumination device capable of changing the light distribution, illumination position, or the like can be used not only for vehicles but also for other purposes.

Regarding illumination devices capable of changing the irradiation direction, when a headlight device for a vehicle is taken as an example, Patent Literature 1 can be cited as an example. Patent Literature 1 discloses a mechanism that changes an irradiation direction of a first sub-lamp unit in a left-right direction or an up-down direction by swinging and turning a semiconductor light emitting element, a reflector, and a projection lens in an integrated manner. Further, it discloses a mechanism that changes an irradiation direction by leveling and driving only a projection lens held by a lens holder, up and down.

CITATION LIST

Patent Literature

Patent Literature 1: Japanese Patent Application Publication No. 2009-87811 (FIGS. 2 and 8)

SUMMARY OF INVENTION

Technical Problem

However, the configuration of Patent Literature 1 simultaneously swings and turns the semiconductor light emitting element, reflector, and projection lens. Thus, the mechanism for changing the irradiation direction is complicated. Further, a projection lens of a typical headlight device is large in size. Thus, when only the projection lens is leveled and driven, the headlight device is large in size when viewed from the front, and the load on the driving mechanism is large.

Solution to Problem

An illumination device includes: a light source that emits light; a condensing optical element that converts the light emitted from the light source into concentrated light and emits the concentrated light; and a projection lens that projects the concentrated light, wherein a light concentration position of the concentrated light is located between the condensing optical element and the projection lens; and the light concentration position is shifted in a direction perpendicular to an optical axis of the projection lens.

Advantageous Effects of Invention

It is possible to provide an illumination device having a simple configuration that prevents the device from increasing in size, and being capable of changing an irradiation direction.

BRIEF DESCRIPTION OF DRAWINGS

FIGS. 23A, 23B, and 23C are explanatory diagrams illustrating simulation results of light ray tracking of the seventh embodiment.

FIG. 24 is a configuration diagram schematically illustrating the main components of a fourth modification.

FIGS. 25A, 25B, and 25C are explanatory diagrams illustrating simulation results of light ray tracking of the fourth modification.

DESCRIPTION OF EMBODIMENTS

Figure 1:
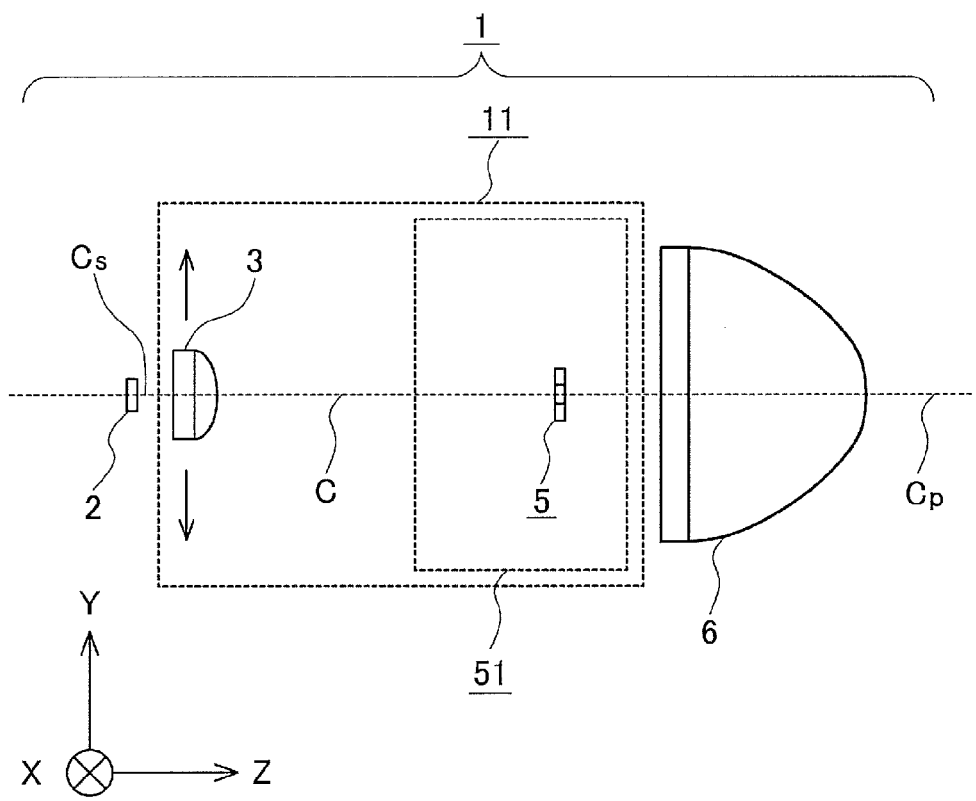
FIG. 1 is a configuration diagram schematically illustrating the main components of a headlight device 1 of a first embodiment of the present invention.

In recent years, there has been an increasing market demand to increase options for the color temperature of illumination light emitted from a headlight device.

For example, Japanese Patent Application Publication No. 2012-221634 discloses a headlight that varies the size of a spot of concentrated light radiated from an excitation light source to a phosphor element. This headlight includes a first light emitting portion and a second light emitting portion that emit fluorescence having different peak wavelengths. It maintains an irradiation area of laser light in the first light emitting portion and varies an irradiation area of laser light in the second light emitting portion. This headlight varies the color temperature by taking advantage of the fact that the excited spectrum of a phosphor element (the first light emitting portion) located at a center is different from that of a phosphor element (the second light emitting portion) located at a periphery.

However, in the headlight described in Japanese Patent Application Publication No. 2012-221634, the color of light emitted from the center of the headlight is different from that of light emitted from the periphery. This causes a problem in that the color temperature of light reaching an object varies between the center and the periphery.

Each of illumination devices of first to fifth embodiments described below can improve the uniformity of color temperature of light and change the color temperature of light projected from the illumination device (including a headlight device).

In the embodiments described below, headlight devices for vehicles will be described as examples with reference to drawings. To facilitate explanation, the description will be made using XYZ-coordinates.

It will be assumed that a left-right direction of a vehicle is the Y axis direction; the right direction with respect to a forward direction of the vehicle is the +Y axis direction; the left direction with respect to the forward direction of the vehicle is the −Y axis direction. Here, "forward direction" refers to a traveling direction of the vehicle. That is, "forward direction" refers to a direction in which the headlight device radiates light.

It will be assumed that an up-down direction of the vehicle is the X axis direction; the upward direction is the +X axis direction; the downward direction is the −X axis direction. The "upward direction" is a direction toward the sky; the "downward direction" is a direction toward the ground (road surface or the like).

It will be assumed that the traveling direction of the vehicle is the Z axis direction; the traveling direction is the +Z axis direction; the opposite direction is the −Z axis direction. The +Z axis direction will be referred to as the "forward direction"; the −Z axis direction will be referred to as the "backward direction". That is, the +Z axis direction is the direction in which the headlight device radiates light. That is, +Z axis direction is the direction in which the illumination device radiates light.

Even when there are modifications in each of the following embodiments, the modifications will be sequentially numbered.

First Embodiment

FIG. 1 is a configuration diagram schematically illustrating the main components of a headlight device 1 of the first embodiment. As illustrated in FIG. 1, the headlight device 1 includes a light source 2, a condensing lens 3, and a projection lens 6. The condensing lens 3 is provided in a wavelength selection portion 11. The wavelength selection portion 11 may include a fluorescence generation portion 51. The fluorescence generation portion 51 includes a phosphor element 5.

<Light Source 2>

The light source 2 emits light that serves as excitation light. The light source 2 is, for example, a light source for excitation, such as a laser diode.

The light source 2 emits, for example, ultraviolet light having a center wavelength of 405 nm, or blue light having a center wavelength of 450 nm.

An optical axis Cs of the light source 2 passes through a center of a light emitting region of a light emitting surface of the light source 2, and is perpendicular to the light emitting surface.

<Wavelength Selection Portion 11>

The wavelength selection portion 11 selects wavelengths of fluorescence emitted by a phosphor. The wavelength selection portion 11 emits the selected fluorescence as projection light. In FIG. 1, the projection light is emitted in the +Z axis direction.

The wavelength selection portion 11 is located in the +Z axis direction from the light source 2. The wavelength selection portion 11 is located optically in the +Z axis direction from the light source 2. Thus, the traveling direction of light emitted from the light source 2 may be changed using a mirror or the like.

In the example of FIG. 1, the wavelength selection portion 11 includes the condensing lens 3 and fluorescence generation portion 51.

<Condensing Lens 3>

The condensing lens 3 concentrates light emitted from the light source 2.

The condensing lens 3 is located on the light source 2 side of the fluorescence generation portion 51 (phosphor element 5).

The condensing lens 3 is an example of a condensing optical element.

In the following embodiments, for example, an optical axis C of the condensing lens 3 is parallel to the Z axis. In the following embodiments, for example, the optical axis C coincides with the optical axis Cs and an optical axis Cp. The optical axis Cp is an optical axis of the projection lens 6, described later.

In each of the following embodiments, for example, the optical axes C, Cs, and Cp may be folded using a mirror or the like. However, in the drawings, the optical axes C, Cs, and Cp are illustrated as straight lines.

In FIG. 1, the condensing lens 3 is illustrated as being plano-convex. However, the condensing lens 3 may be biconvex.

The condensing lens 3 may have an arbitrary shape as long as it concentrates incident light on the phosphor element 5 of the fluorescence generation portion 51. The condensing lens 3 may consist of two lenses.

The condensing lens 3 can shift in a direction perpendicular to the optical axis C. For example, in FIG. 1, the direction perpendicular to the optical axis C is the Y axis direction. That is, in FIG. 1, as an example, the condensing lens 3 can shift in the Y axis direction.

For example, the position of the condensing lens 3 at which the optical axis C of the condensing lens 3 coincides with the optical axis Cp of the projection lens 6 is taken as a reference position of the condensing lens 3.

Thereby, the condensing lens 3 can shift a light concentration position of excitation light emitted from the excitation light source 2, in the Y axis direction on the phosphor element 5. When the condensing lens 3 consists of two lenses, the two lenses are integrally shifted in the Y axis direction.

<Fluorescence Generation Portion 51 and Phosphor Element 5>

The fluorescence generation portion 51 receives, by the phosphor element 5, concentrated light emitted from the condensing lens 3 and emits light of different wavelengths.

Figure 2:
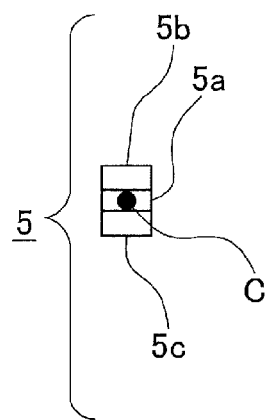
FIG. 2 is an explanatory diagram for explaining a configuration of a phosphor element.

The fluorescence generation portion 51 includes the phosphor element 5. FIG. 2 is an explanatory diagram illustrating an example of a configuration of the phosphor element 5. FIG. 2 is a view of the phosphor element 5 as viewed from the −Z axis direction side. Since the optical axis C is parallel to the Z axis, it is represented by a black dot in FIG. 2.

The phosphor element 5 is divided into multiple regions. The phosphor element 5 is divided into multiple regions in a direction perpendicular to the optical axis C. For example, the phosphor element 5 is divided into three regions in the Y axis direction. For example, the phosphor element 5 includes regions 5a, 5b, and 5c.

The region 5a emits fluorescence of, for example, 6000 K. The region 5b emits fluorescence of, for example, 4000 K. The region 5c emits fluorescence of, for example, 2500 K.

When the condensing lens 3 is at the reference position, the region 5a is located on the optical axis C of the condensing lens 3. The region 5b is located, for example, on the +Y axis direction side of the optical axis C. The region 5c is located, for example, on the −Y axis direction side of the optical axis C.

Also, the region 5a is located on the optical axis Cp of the projection lens 6. The region 5b is located, for example, on the +Y axis direction side of the optical axis Cp. The region 5c is located, for example, on the −Y axis direction side of the optical axis Cp.

The number of regions of the phosphor element 5 may be two. Depending on the intended use, the phosphor element 5 may be divided into regions in the X axis direction. In this case, for example, when the condensing lens 3 is at the reference position, the optical axis C passes through one of the two regions.

The diameter of excitation light concentrated on the phosphor element 5 is, for example, 0.5 mm.

<Projection Lens 6>

The projection lens 6 projects fluorescence emitted by the fluorescence generation portion 51, in the +Z axis direction. The projection lens 6 projects a light distribution pattern formed at a focal position of the projection lens 6 in a direction of the optical axis Cp of the projection lens 6, in the forward direction. For example, when a focal point of the projection lens 6 is located on a light emitting surface of the phosphor element 5, the projection lens 6 projects an image corresponding to a light intensity distribution formed in the light emitting surface of the phosphor element 5.

By projecting the image on the light emitting surface of the phosphor element 5 in this manner, it is possible to easily form a light distribution pattern. When a circular spot is formed, the phosphor element 5 may have a circular light emitting surface so as to form a circular light intensity distribution. The projection lens 6 can project an image based on the shape of the light emitting surface. The projection lens 6 can project an image based on the shape of a light emitting portion in the light emitting surface. In the direction of the optical axis Cp, the light concentration position coincides with the focal position of the projection lens.

<Operation of Headlight Device 1>

The operation of the headlight device 1 will now be described.

The condensing lens 3 shifts, for example, in the Y axis direction.

When the condensing lens 3 is shifted in the +Y axis direction, light emitted from the condensing lens 3 travels while tilting in the +Y axis direction. Thus, the condensing lens 3 can concentrate the excitation light on the region 5b of the phosphor element 5.

When the condensing lens 3 is shifted in the −Y axis direction, light emitted from the condensing lens 3 travels while tilting in the −Y axis direction. Thus, the condensing lens 3 can concentrate the excitation light on the region 5c of the phosphor element 5. The amount of shift of the condensing lens 3 is set depending on the light concentration position of the excitation light on the phosphor element 5.

Figure 16:
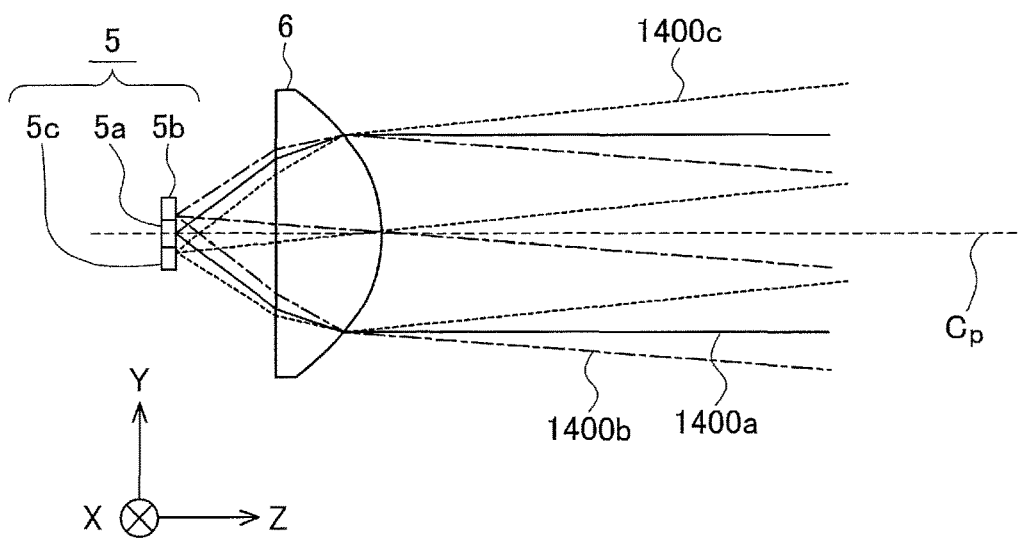
FIG. 16 is a schematic diagram of light rays for explaining effects of a fourth embodiment.

FIG. 16 is a schematic diagram of light ray trajectories of light rays traveling from the phosphor element 5 in the +Z axis direction.

In FIG. 16, the optical axis Cp coincides with the optical axis C, as in the case where the condensing lens 3 is at the reference position in the first embodiment.

Lights 1400b and 1400c emitted from the regions 5b and 5c are not located on the optical axis C, on the phosphor element 5. Thus, typically, the lights 1400b and 1400c emitted from the regions 5b and 5c are oblique to the optical axis Cp after passing through the projection lens 6. That is, the lights 1400b and 1400c emitted from the regions 5b and 5c are not parallel to the optical axis Cp after passing through the projection lens 6.

However, by increasing the distance from the phosphor element 5 to the projection lens 6, the positions of the lights 1400b and 1400c relative to the position of the light 1400a on an irradiation position can be located so that there is no problem in practical use. Even when the phosphor element 5 is divided into the three regions 5a, 5b, and 5c, light emitted from each of the regions 5a, 5b, and 5c is converted by the projection lens 6 into light parallel to the optical axis Cp to the extent that there is no problem in practical use.

For example, in Europe, the projection lens 6 can be spaced 60 mm from the phosphor element 5 in the Z axis direction. It is assumed that the amount of displacement of the light distribution is 0.5 degrees.

Here, in each of the embodiments, "irradiation position" refers to a position irradiated by light projected from the headlight device (illumination device). For example, irradiation positions for vehicles are specified by road traffic rules or the like. For example, in Europe, United Nations Economic Commission for Europe (UNECE) specifies a position 25 m from a light source as the position at which the luminous intensity of an automobile headlight device is measured. In Japan, Japanese Industrial Standards Committee (JIS) specifies a position 10 m from a light source as the position at which the luminous intensity is measured.

On the other hand, when the direction of the projected light is positively changed, the distance from the phosphor element 5 to the projection lens 6 can be made small. By changing the distance from the phosphor element 5 to the projection lens 6 continuously or in steps, the amount of shift in the light distribution direction can be changed.

With the above operation, when the optical axis C of the condensing lens 3 coincides with the optical axis Cp of the projection lens 6, excitation light emitted from the light source 2 concentrates on the region 5a of the phosphor element 5. When the optical axis C of the condensing lens 3 is shifted in the +Y axis direction with respect to the optical axis Cp, excitation light emitted from the light source 2 concentrates on the region 5b of the phosphor element 5. When the optical axis C of the condensing lens 3 is shifted in the −Y axis direction with respect to the optical axis Cp, excitation light emitted from the light source 2 concentrates on the region 5c of the phosphor element 5.

Thus, by shifting the condensing lens 3 in the Y axis direction, it is possible to shift the light concentration position of the excitation light on the phosphor element 5. This makes it possible to switch between the three color temperatures. By providing a space between each region, providing an aluminum coating layer between each region, or other ways, mixture of lights having different color temperatures is prevented. This prevents occurrence of color unevenness of light emitted from the projection lens 6.

The number of regions of the phosphor element 5 is not limited and may be two or four. The distance between the phosphor element 5 and the projection lens 6 is a distance such that light having a parallelism without problem in practical use is obtained. Thus, in particular, since the phosphor element 5 is always located on the optical axis Cp, light after passing through the projection lens 6 is parallel to the optical axis Cp.

<First Modification>

Figure 3:
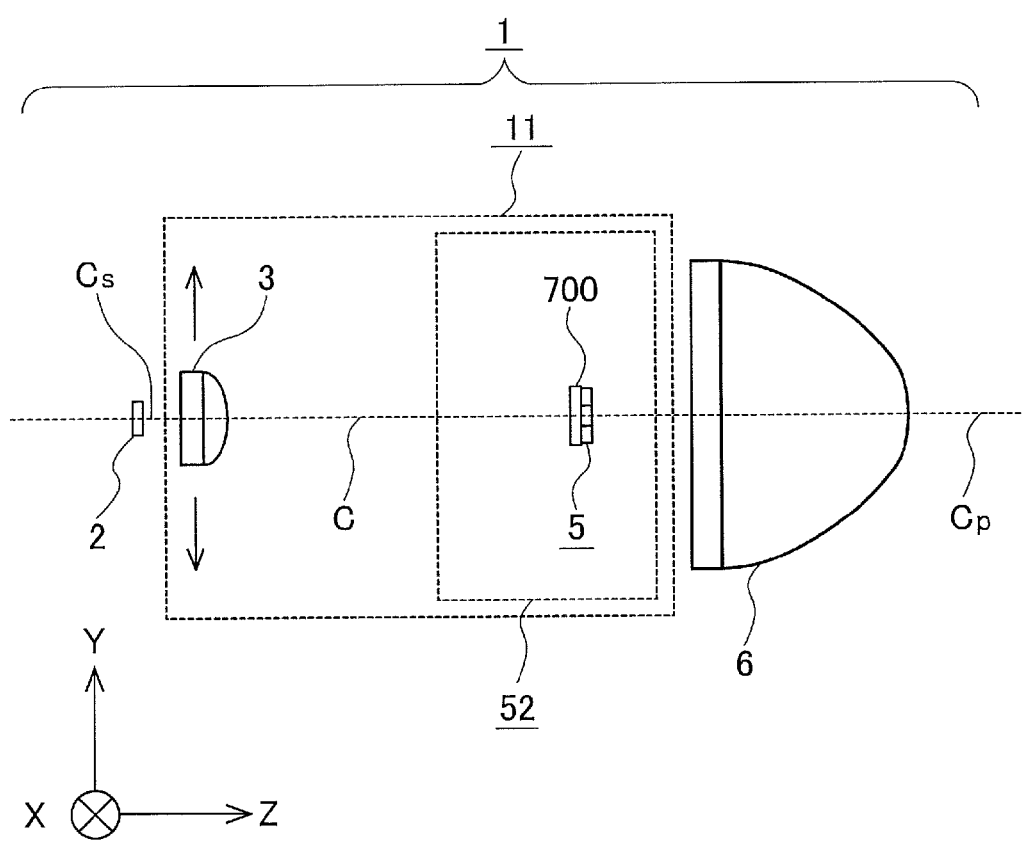
FIG. 3 is a configuration diagram schematically illustrating another configuration of the headlight device 1 of a first modification.

FIG. 3 is a configuration diagram schematically illustrating another configuration of the headlight device 1 of the first embodiment of the present invention. In FIG. 3, the fluorescence generation portion 51 in FIG. 1 is replaced with a fluorescence generation portion 52 having a different configuration.

As illustrated in FIG. 3, in the fluorescence generation portion 52, a wavelength selection element 700 is disposed on the light source 2 side of the phosphor element 5. The wavelength selection element 700 is disposed between the condensing lens 3 and the phosphor element 5. In FIG. 3, the wavelength selection element 700 is disposed on a surface of the phosphor element 5 on the −Z axis side.

The wavelength selection element 700 reflects light of wavelengths other than the wavelengths of excitation light emitted by the light source 2. The wavelength selection element 700 transmits excitation light emitted by the light source 2. The wavelength selection element 700 reflects, for example, fluorescence emitted by the phosphor element 5.

By disposing the wavelength selection element 700, fluorescence emitted from the phosphor element 5 toward the light source 2 is reflected by the wavelength selection element 700 toward the projection lens 6. This improves light use efficiency.

The wavelength selection element 700 may include multiple regions. The number of regions of the wavelength selection element 700 is, for example, three similarly to the phosphor element 5. Fluorescence emitted from each region of the phosphor element 5 toward the light source 2 is reflected by a corresponding region of the wavelength selection element 700 toward the projection lens 6.

Thus, the color of light emitted from the headlight device 1 is determined by mixed light of fluorescence emitted from each region of the phosphor element 5 and light reflected by the wavelength selection element 700. This makes it possible to extend a setting range of the color of light emitted from the headlight device 1.

For example, in this configuration, each region of the wavelength selection element 700 may be configured to reflect only light of wavelengths included in fluorescence emitted from a corresponding region of the phosphor element 5. The configuration of the first modification can improve efficiency of fluorescence emitted from the phosphor element 5.

<Second Modification>

Figure 4:
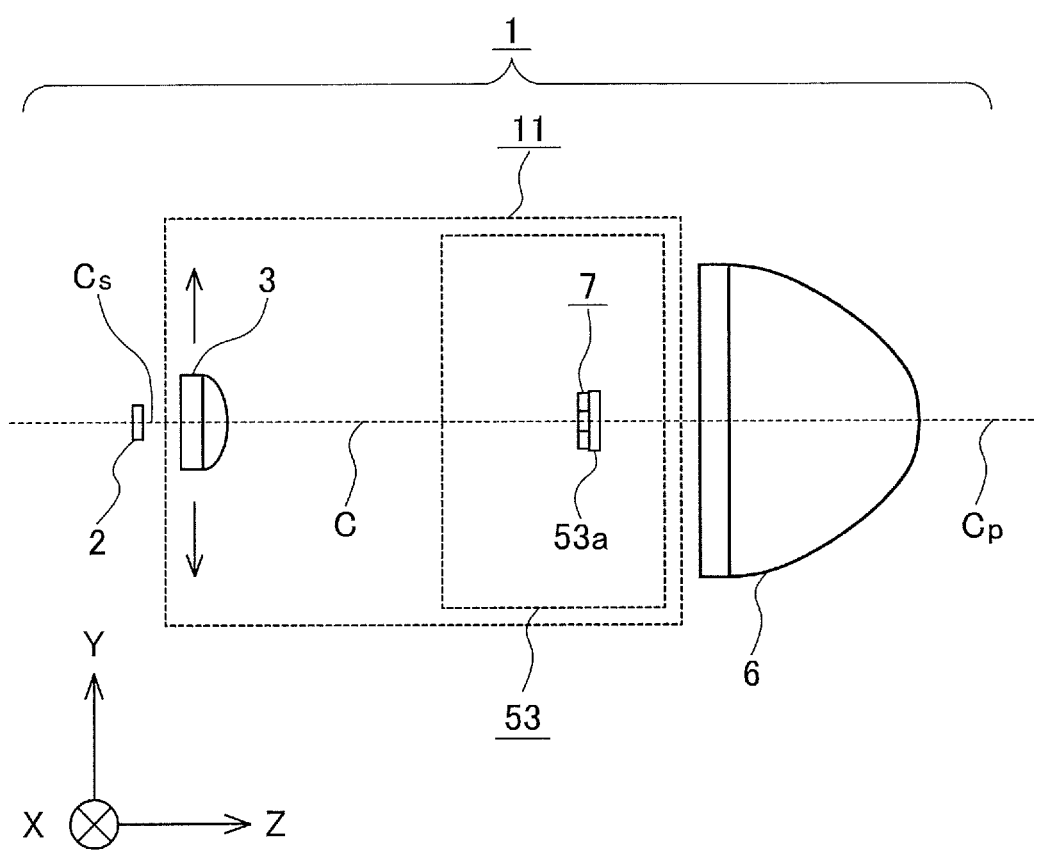
FIG. 4 is a configuration diagram schematically illustrating the main components of a headlight device 1 of a second modification.

FIG. 4 is a configuration diagram schematically illustrating the main components of a headlight device 1 according to a second modification. A fluorescence generation portion 53 differs in configuration from that of the first embodiment. The other components are the same as those of the first embodiment, so descriptions thereof will be omitted.

The fluorescence generation portion 53 of the second modification differs in that a phosphor element 53a is not divided into multiple regions. That is, the phosphor element 53a is formed by a single region. Further, the fluorescence generation portion 53 differs from the fluorescence generation portion 51 in having a wavelength selection element 7.

As illustrated in FIG. 4, the wavelength selection element 7 is located on the −Z axis direction side of the phosphor element 53a. The wavelength selection element 7 is located between the condensing lens 3 and the phosphor element 53a. In FIG. 4, the wavelength selection element 7 is located on a surface of the phosphor element 53a on the −Z axis side.

Thus, light emitted from the light source 2 reaches the phosphor element 53a after passing through the wavelength selection element 7.

Figure 5:
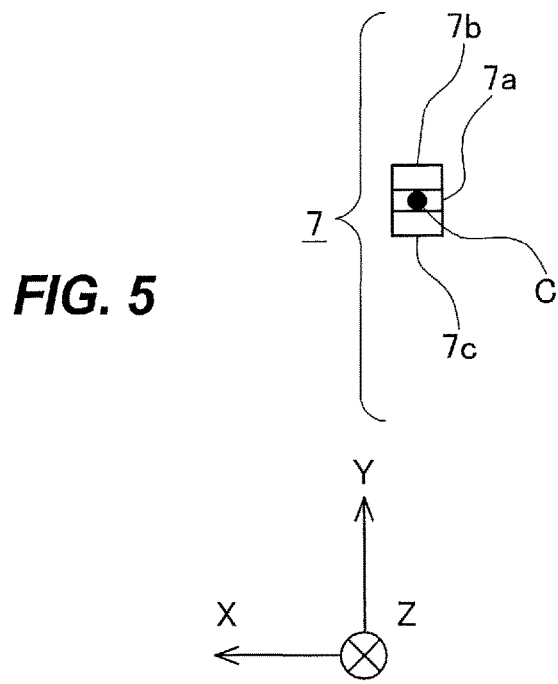
FIG. 5 is an explanatory diagram for explaining a configuration of a wavelength selection element.

FIG. 5 is an explanatory diagram for explaining a configuration of the wavelength selection element 7. FIG. 5 is a diagram of the wavelength selection element 7 as viewed from the −Z axis direction side. Since the optical axis C is parallel to the Z axis, it is represented by a black dot in FIG. 5.

The wavelength selection element 7 is divided into three regions 7a, 7b, and 7c in the Y axis direction.

The regions 7a, 7b, and 7c have mutually different wavelength selection characteristics. That is, the regions 7a, 7b, and 7c transmit mutually different wavelength regions.

Figure 6:
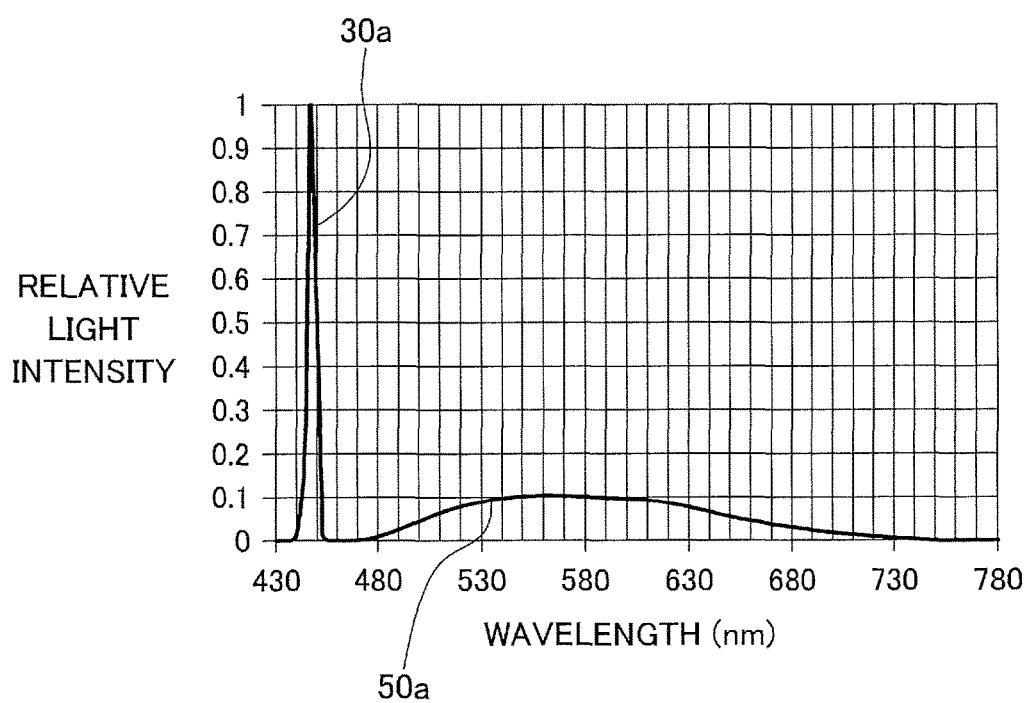
FIG. 6 is a diagram illustrating an example of a wavelength characteristic of light after passing through a region 7b and being emitted from a phosphor element, in the second modification.

FIG. 6 is a diagram illustrating an example of a wavelength characteristic of light after passing through the region 7a and being emitted from the phosphor element 53a. The vertical axis of FIG. 6 represents a relative light intensity (relative energy). The characteristic of FIG. 6 is normalized by the maximum light intensity. Thus, the maximum value in the vertical axis is "1". The horizontal axis of FIG. 6 represents wavelength (nm).

In FIG. 6, a spectrum of excitation light emitted from the light source 2 is the curved line 30a shown in the wavelength range of from 440 nm to 460 nm. A spectrum of fluorescence generated by excitation of the phosphor element 53a is the curved line 50a shown in the wavelength region of from 470 nm to 780 nm.

Figure 7:
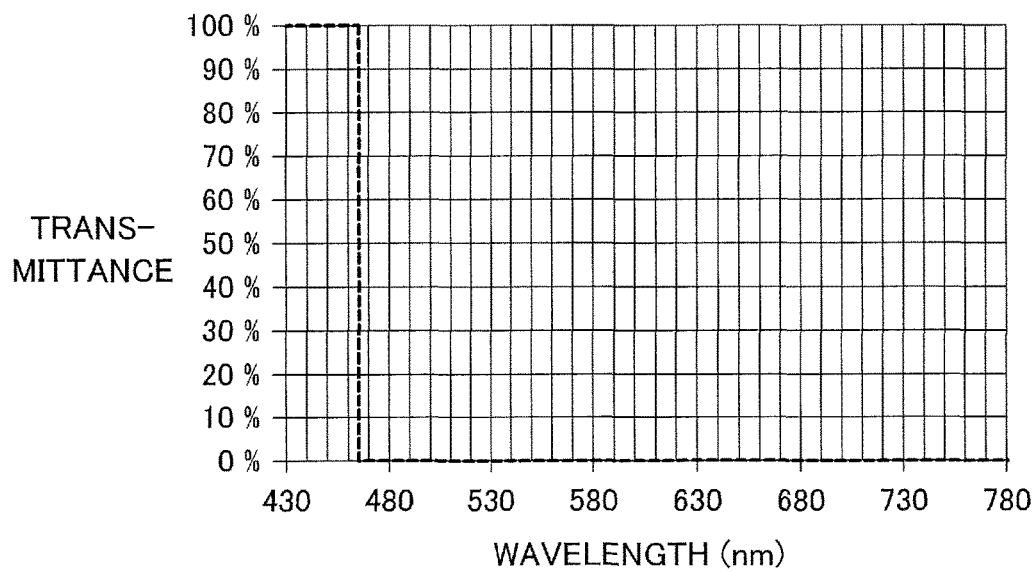
FIG. 7 is a diagram illustrating an example of a transmittance-wavelength characteristic of the region 7b of the second modification.

FIG. 7 is a diagram illustrating an example of a transmittance-wavelength characteristic of the region 7a of the wavelength selection element 7. The vertical axis of FIG. 7 represents transmittance (%). The horizontal axis of FIG. 7 represents wavelength (nm).

In FIG. 7, an actual transmittance-wavelength characteristic (characteristic of transmittance with respect to wavelength) requires a wavelength width of from 5 nm to 10 nm until the value of the transmittance stabilizes at the changing point. Thus, it is a curved line at the changing point. For convenience of explanation, in FIG. 7, the wavelength width until the value of the transmittance stabilizes at the changing point is not considered.

FIG. 7 represents the characteristic that the region 7a of the wavelength selection element 7 transmits 100% of light of wavelengths less than 465 nm. FIG. 7 also represents the characteristic that the region 7a reflects 100% of light of wavelengths greater than 465 nm.

The wavelength selection element 7 transmits, in the region 7a, all excitation light emitted from the light source 2.

Part of light passing through the region 7a is used by the phosphor element 53a as excitation light. Fluorescence generated by excitation of the phosphor element 53a also travels in the −Z axis direction. However, the fluorescence traveling in the −Z axis direction is reflected by the region 7a.

The fluorescence reflected by the region 7a travels in the +Z axis direction. Thus, excitation light emitted from the light source 2 is, for example, converted into fluorescence having a color temperature of 5000 K and emitted from the phosphor element 53a (fluorescence generation portion 53).

Figure 8:
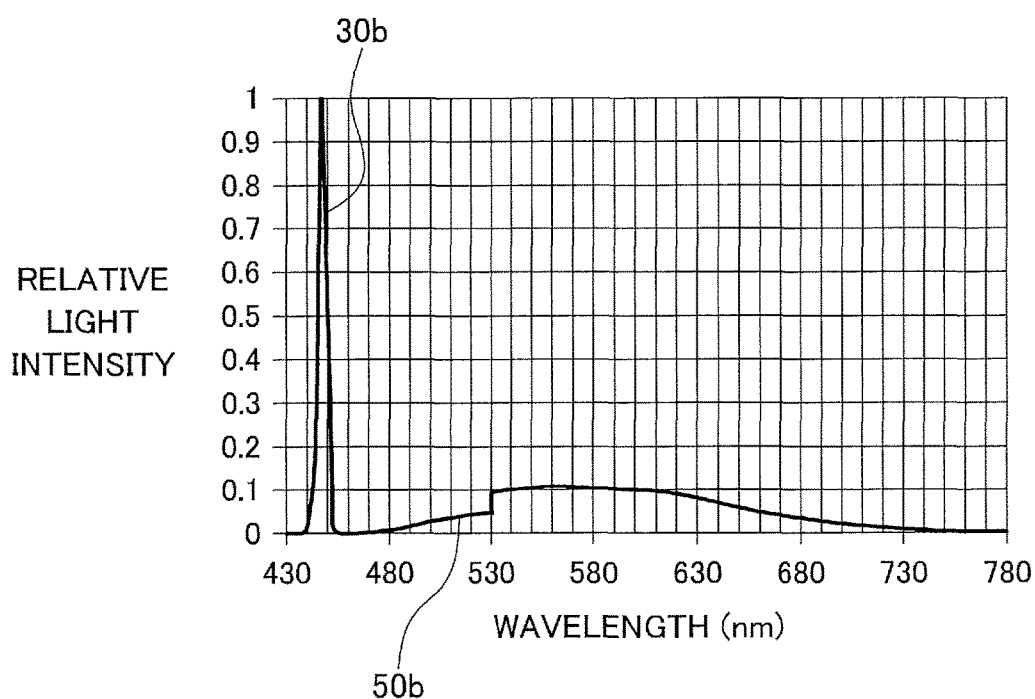
FIG. 8 is a diagram illustrating an example of a wavelength characteristic of light after passing through a region 7a and being emitted from the phosphor element, in the second modification.

FIG. 8 is a diagram illustrating an example of a wavelength characteristic of light after passing through the region 7b and being emitted from the phosphor element 53a. The vertical axis of FIG. 8 represents a relative light intensity (relative energy). The characteristic of FIG. 8 is normalized by the maximum light intensity. Thus, the maximum value in the vertical axis is "1". The horizontal axis of FIG. 8 represents wavelength (nm).

In FIG. 8, a spectrum of excitation light emitted from the light source 2 is the curved line 30b shown in the wavelength range of from 440 nm to 460 nm. A spectrum of fluorescence generated by excitation of the phosphor element 53a is the curved line 50b shown in the wavelength region of from 470 nm to 780 nm.

Figure 9:
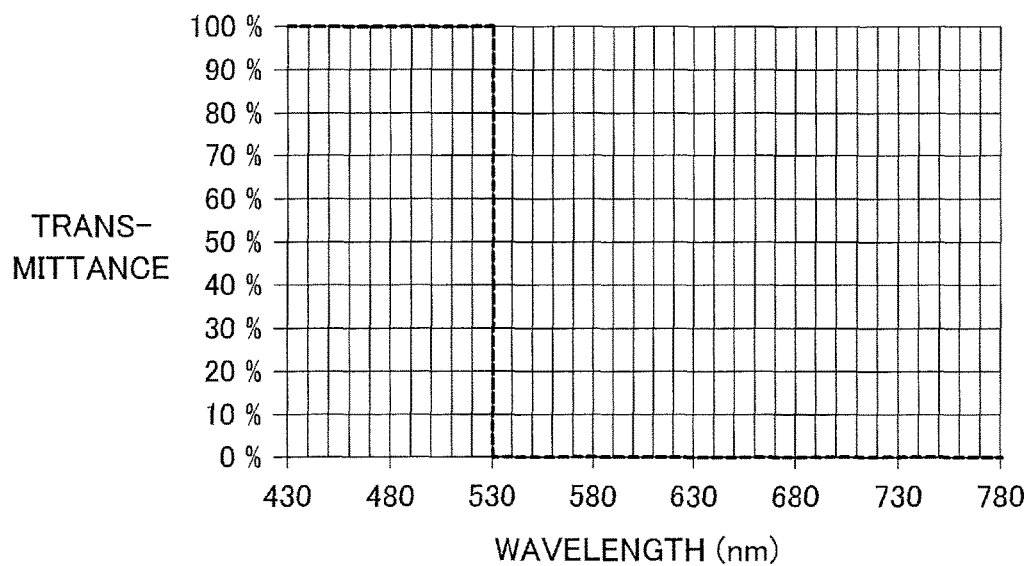
FIG. 9 is a diagram illustrating an example of a transmittance-wavelength characteristic of the region 7a of the second modification.

FIG. 9 is a diagram illustrating an example of a transmittance-wavelength characteristic (characteristic of transmittance with respect to wavelength) of the region 7b of the wavelength selection element 7. The vertical axis of FIG. 9 represents transmittance (%). The horizontal axis of FIG. 9 represents wavelength (nm).

As in FIG. 7, also in FIG. 9, the wavelength width until the value of the transmittance stabilizes at the changing point is not considered.

FIG. 9 represents the characteristic that the region 7b of the wavelength selection element 7 transmits 100% of light of wavelengths less than 530 nm. FIG. 9 represents the characteristic that the region 7b reflects 100% of light of wavelengths greater than 530 nm.

The wavelength selection element 7 transmits, in the region 7b, all excitation light emitted from the light source 2.

Part of light passing through the region 7b is used by the phosphor element 53a as excitation light. Fluorescence generated by excitation of the phosphor element 53a also travels in the −Z axis direction. However, of the fluorescence traveling in the −Z axis direction, the fluorescence of wavelengths greater than 530 nm is reflected by the region 7b; the fluorescence of wavelengths less than 530 nm passes through the region 7b and travels in the −Z axis direction.

The fluorescence reflected by the region 7b travels in the +Z axis direction. Thus, excitation light emitted from the light source 2 is, for example, converted into fluorescence having a color temperature of 4400 K and emitted from the phosphor element 53a (fluorescence generation portion 53).

Here, as an example, it is assumed that the percentage of the fluorescence that is generated by excitation of the phosphor element 53a and is emitted in the +Z axis direction is 50%, and the percentage of the fluorescence that is emitted in the −Z axis direction, is reflected by the wavelength selection element 7, and travels in the +Z axis direction is 50%.

The percentage of the fluorescence that is generated by excitation of the phosphor element 53a and travels in the −Z axis direction depends on a diffusion characteristic or the like of the phosphor element 53a, and therefore is not limited to 50%. Here, 50% is taken as an example.

Thus, the spectrum from 470 nm to 530 nm of FIG. 8 is half that of FIG. 6.

Figure 10:
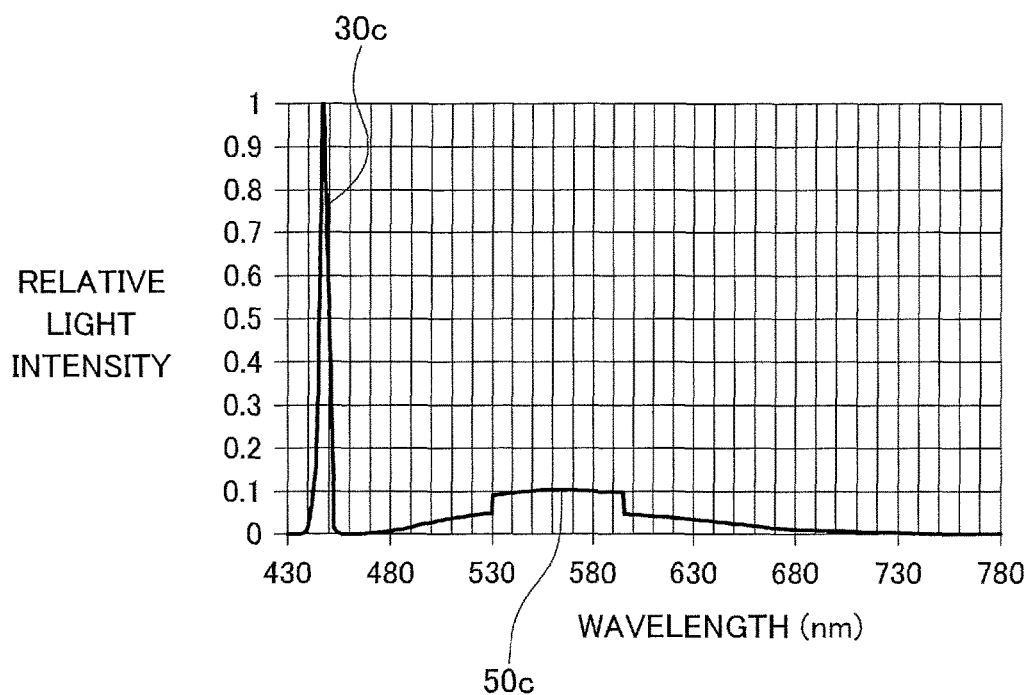
FIG. 10 is a diagram illustrating an example of a wavelength characteristic of light after passing through a region 7c and being emitted from the phosphor element, in the second modification.

FIG. 10 is a diagram illustrating an example of a wavelength characteristic of light after passing through the region 7c and being emitted from the phosphor element 53a. The vertical axis of FIG. 10 represents a relative light intensity (relative energy). The characteristic of FIG. 10 is normalized by the maximum light intensity. Thus, the maximum value in the vertical axis is "1". The horizontal axis of FIG. 10 represents wavelength (nm).

In FIG. 10, a spectrum of excitation light emitted from the light source 2 is the curved line 30c shown in the wavelength range of from 440 nm to 460 nm. A spectrum of fluorescence generated by excitation of the phosphor element 53a is the curved line 50c shown in the wavelength region of from 470 nm to 780 nm.

Figure 11:
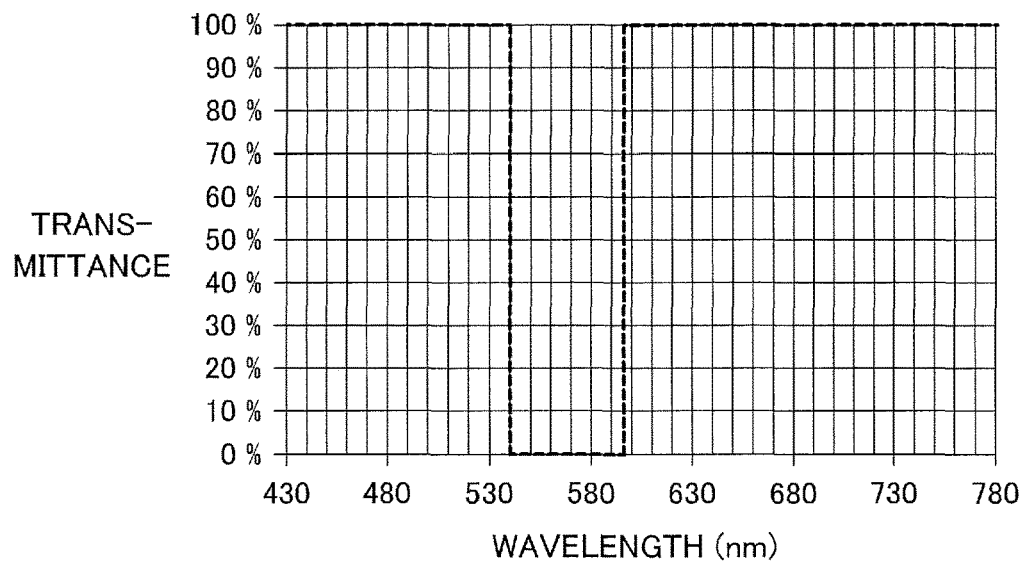
FIG. 11 is a diagram illustrating an example of a transmittance-wavelength characteristic of the region 7c of the second modification.

FIG. 11 is a diagram illustrating an example of a transmittance-wavelength characteristic (characteristic of transmittance with respect to wavelength) of the region 7c of the wavelength selection element 7. The vertical axis of FIG. 11 represents transmittance (%). The horizontal axis of FIG. 11 represents wavelength (nm).

As in FIG. 7, also in FIG. 11, the wavelength width until the value of the transmittance stabilizes at the changing point is not considered.

FIG. 11 represents the characteristic that the region 7c of the wavelength selection element 7 transmits 100% of light of wavelengths less than 540 nm. FIG. 11 represents the characteristic that the region 7c reflects 100% of light of wavelengths from 540 nm to 595 nm. FIG. 11 represents the characteristic that the region 7c transmits 100% of light of wavelengths greater than 595 nm.

The wavelength selection element 7 transmits, in the region 7c, all excitation light emitted from the light source 2.

Part of light passing through the region 7c is used by the phosphor element 53a as excitation light. Fluorescence generated by excitation of the phosphor element 53a also travels in the −Z axis direction. However, of the fluorescence traveling in the −Z axis direction, the fluorescence of wavelengths from 540 nm to 595 nm is reflected by the region 7c; the fluorescence of wavelengths less than 540 nm and the fluorescence of wavelengths greater than 595 nm pass through the region 7b and travel in the −Z axis direction.

The fluorescence reflected by the region 7c travels in the +Z axis direction. Thus, excitation light emitted from the light source 2 is, for example, converted into fluorescence having a color temperature of 5900 K and emitted from the phosphor element 53a (fluorescence generation portion 53).

Here, as an example, it is assumed that the percentage of the fluorescence that is generated by excitation of the phosphor element 53a and is emitted in the +Z axis direction is 50%, and the percentage of the fluorescence that is emitted in the −Z axis direction, is reflected by the wavelength selection element 7, and travels in the +Z axis direction is 50%.

The percentage of the fluorescence that is generated by excitation of the phosphor element 53a and travels in the −Z axis direction depends on a diffusion characteristic or the like of the phosphor element 53a, and therefore is not limited to 50%. Here, 50% is taken as an example.

Thus, the spectrum from 470 nm to 540 nm and the spectrum from 595 nm to 780 nm of FIG. 10 are half those of FIG. 6.

As described above, in the configuration of the second modification, the phosphor element 53a is not divided into regions. Thus, the phosphor element 53a emits one type of fluorescence. However, dividing the wavelength selection element 7 into the regions 7a, 7b, and 7c allows the fluorescence generation portion 53 to emit light having different color temperatures toward the projection lens 6.

Further, by shifting the condensing lens 3 in the Y axis direction, it is possible to select light having different color temperatures. Here, a case where the color temperatures are 4400 K, 5000 K, and 5900 K has been described. However, by considering the characteristics of the phosphor element 53a or the transmittance-wavelength characteristics of the regions 7a, 7b, and 7c of the wavelength selection element 7, it is possible to emit light having color temperatures different from those of the second modification. "Transmittance-wavelength characteristic" refers to a characteristic of transmittance with respect to wavelength.

The wavelength selection element 7 is divided into regions, which allows the color temperature of light emitted from the phosphor element 53a to vary among the regions of the wavelength selection element 7. The wavelength selection element 7 is divided into regions, which can reduce color unevenness.

Second Embodiment

Figure 12:
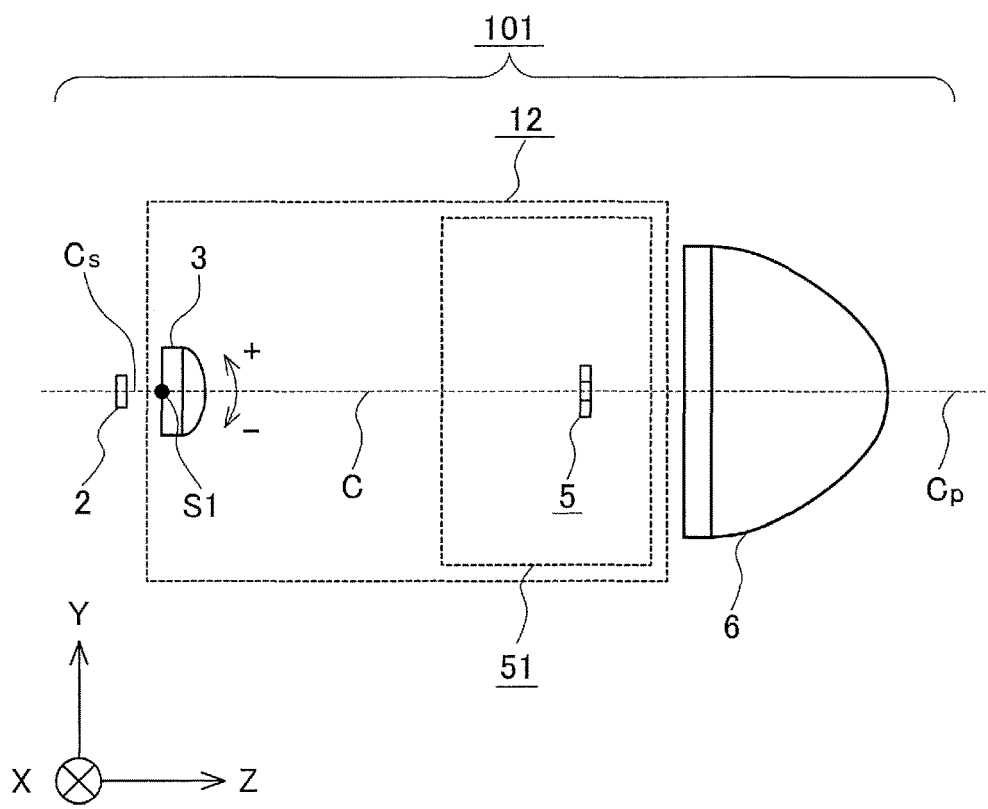
FIG. 12 is a configuration diagram schematically illustrating the main components of a headlight device 101 of a second embodiment of the present invention.

FIG. 12 is a configuration diagram schematically illustrating the main components of a headlight device 101 of the second embodiment.

As illustrated in FIG. 12, the headlight device 101 includes a light source 2, a condensing lens 3, and a projection lens 6. The condensing lens 3 is provided in a wavelength selection portion 12. The wavelength selection portion 12 may include a fluorescence generation portion 51. The fluorescence generation portion 51 includes a phosphor element 5.

An example of the embodiment of the present invention will be described with reference to drawings by taking, as an example, a headlight device for a vehicle as in the first embodiment. To facilitate explanation, the following description of the embodiment will be made using XYZ-coordinates that is the same as those of the first embodiment.

Elements that are the same as those of the first embodiment will be given the same reference characters, and descriptions thereof will be omitted. The light source 2, fluorescence generation portion 51, and projection lens 6 are the same as those of the first embodiment. The phosphor element 5 provided in the fluorescence generation portion 51 is also the same as that of the first embodiment.

The condensing lens 3 itself is the same as that of the first embodiment. Thus, in the second embodiment, the reference character 3 is used as in the first embodiment. However, as described later, the way to move the condensing lens 3 differs from that of the first embodiment.

For the configurations, functions, operations, or the like of the elements that are the same as those of the first embodiment, even when their descriptions are omitted in the second embodiment, the descriptions in the first embodiment are substituted. Descriptions regarding the first embodiment described in the second embodiment are used as descriptions of the first embodiment. Here, "operation" includes the behavior of light.

<Light Source 2>

The light source 2 emits light that serves as excitation light. The light source 2 is a light source for excitation.

As described above, the light source 2 is the same as that of the first embodiment, so a description thereof will be omitted by substituting the description in the first embodiment.

<Wavelength Selection Portion 12>

The wavelength selection portion 12 selects wavelengths of fluorescence emitted by the phosphor. The wavelength selection portion 12 emits the selected fluorescence as projection light. In the example of FIG. 12, the wavelength selection portion 12 includes the condensing lens 3 and fluorescence generation portion 51.

<Condensing Lens 3>

The condensing lens 3 concentrates light emitted from the light source 2.

As described above, the condensing lens 3 itself is the same as that of the first embodiment, so a description thereof will be omitted by substituting the description in the first embodiment. Since the operation of the condensing lens 3 differs from that of the first embodiment, it will be described below.

The condensing lens 3 can swing about an axis S1 that passes through the optical axis C and, for example, is parallel to the X axis. The axis S1 orthogonally intersects with the axis C. In FIG. 12, for example, the axis S1 is located on an incident surface of the condensing lens 3. In other words, the axis S1 is a first axis perpendicular to the optical axis C.

"Swing" refers to swinging. For example, in FIG. 12, it indicates that as viewed from the −X axis direction side, the condensing lens 3 turns by a predetermined angle clockwise or counterclockwise about the axis S1. Here, the predetermined angle is, for example, an angle less than 90 degrees. Typically, the predetermined angle is, for example, 5 degrees.

Swinging of the condensing lens 3 about the axis S1 can shift the light concentration position of excitation light emitted from the light source 2 on the phosphor element 5, in the Y axis direction.

For example, when the condensing lens 3 consists of two lenses, the two lenses are integrated. The axis S1 is located on an incident surface of one of the two lenses on the light source 2 side.

The axis S1 may be located on an emitting surface of the condensing lens 3.

<Fluorescence Generation Portion 51>

The fluorescence generation portion 51 is the same as that of the first embodiment, so a description thereof will be omitted by substituting the description in the first embodiment.

As in the case where the condensing lens 3 is at the reference position in the first embodiment, the region 5a is located on the optical axis C of the condensing lens 3. The region 5b is located, for example, on the +Y axis direction side of the optical axis C. The region 5c is located, for example, on the −Y axis direction side of the optical axis C.

<Projection Lens 6>

The projection lens 6 projects fluorescence emitted by the fluorescence generation portion 51, in the +Z axis direction. The projection lens 6 projects a light distribution pattern formed at a focal position of the projection lens 6 in a direction of the optical axis Cp of the projection lens 6, in the forward direction. The projection lens 6 is the same as that of the first embodiment, so a description thereof will be omitted by substituting the description in the first embodiment.

<Operation of Headlight Device 101>

The operation of the headlight device 101 will now be described.

When the condensing lens 3 is turned about the axis S1 counterclockwise as viewed from the −X axis direction side, light emitted from the condensing lens 3 travels while tilting in the +Y axis direction. Thus, the condensing lens 3 can concentrate the excitation light on the region 5b of the phosphor element 5. Turning the condensing lens 3 about the axis S1 counterclockwise as viewed from the −X axis direction side will be referred to as "swinging the condensing lens 3 in the +Y axis direction."

When the condensing lens 3 is turned about the axis S1 clockwise as viewed from the −X axis direction side, light emitted from the condensing lens 3 travels while tilting in the −Y axis direction. Thus, the condensing lens 3 can concentrate the excitation light on the region 5c of the phosphor element 5. Turning the condensing lens 3 about the axis S1 clockwise as viewed from the −X axis direction side will be referred to as "swinging the condensing lens 3 in the −Y axis direction."

The swing angle is set depending on the light concentration position on the phosphor element 5.

When the central axis S1 of the swing is located on the emitting surface side of the condensing lens 3, the position of the optical axis C on the incident surface of the condensing lens 3 moves in a direction opposite to a direction of rotation of the condensing lens 3, in the Y axis direction.

Thus, in a case where the central axis S1 is located on the emitting surface side of the condensing lens 3, for example, when the condensing lens 3 is turned about the axis S1 counterclockwise as viewed from the −X axis direction side, light emitted from the condensing lens 3 travels while tilting in the −Y axis direction. When the condensing lens 3 is turned about the axis S1 clockwise as viewed from the −X axis direction side, light emitted from the condensing lens 3 travels while tilting in the +Y axis direction.

The operation exhibited when the central axis S1 of the swing is located on the emitting surface side of the condensing lens 3 differs from the operation exhibited when the central axis S1 is located on the incident surface side of the condensing lens 3.

When the central axis S1 of the swing is located on the incident surface side of the condensing lens 3, the position of the optical axis C on the incident surface of the condensing lens 3 is stationary, only swinging of the condensing lens 3 affects the light ray direction, and an effect on the light ray aberration is small. Thus, it is preferable that the central axis S1 of the swing be located on the incident surface side of the condensing lens 3. Depending on the usage, structural constraints, or the like, the central axis S1 may be located on the emitting surface side of the condensing lens 3.

Lights emitted from the regions 5b and 5c are not located on the optical axis Cp of the projection lens 6. Thus, typically, lights emitted from the regions 5b and 5c are oblique to the optical axis Cp after passing through the projection lens 6. That is, lights emitted from the regions 5b and 5c are not parallel to the optical axis Cp after passing through the projection lens 6. In the second embodiment, the optical axis Cp of the projection lens 6 coincides with the optical axis C of the condensing lens 3, as in the first embodiment.

However, as described in the first embodiment, by increasing the distance from the phosphor element 5 to the projection lens 6, the positions of the lights on an irradiation position can be located so that there is no problem in practical use. Even when the phosphor element 5 is divided into the three regions 5a, 5b, and 5c, light emitted from each of the regions 5a, 5b, and 5c is converted by the projection lens 6 into light parallel to the optical axis Cp to the extent that there is no problem in practical use.

On the other hand, when the direction of the projected light is positively changed, the distance from the phosphor element 5 to the projection lens 6 can be made small. By changing the distance from the phosphor element 5 to the projection lens 6 continuously or in steps, the amount of change in the light distribution direction can be changed.

The fluorescence generation portion 52 described in the first embodiment may be applied to the second embodiment, and the same effect can be obtained.

With the above operation, when the optical axis C of the condensing lens 3 coincides with the optical axis Cp of the projection lens 6 in the Y axis direction, excitation light emitted from the light source 2 concentrates on the region 5a of the phosphor element 5. When the optical axis C of the condensing lens 3 is swung in the +Y axis direction with respect to the optical axis Cp of the projection lens 6, excitation light emitted from the light source 2 concentrates on the region 5b of the phosphor element 5. When the optical axis C of the condensing lens 3 is swung in the −Y axis direction with respect to the optical axis Cp of the projection lens 6, excitation light emitted from the light source 2 concentrates on the region 5c of the phosphor element 5.

Thus, by swinging the condensing lens 3 about the axis S1, it is possible to shift the light concentration position on the phosphor element 5. This makes it possible to switch between the three color temperatures. Further, as in the first embodiment, providing a space or the like between each region prevents mixture of lights having different color temperatures, thereby preventing occurrence of color unevenness of light emitted from the projection lens 6.

The number of regions of the phosphor element 5 is not limited and may be two or four. The distance between the phosphor element 5 and the projection lens 6 is a distance such that light having a parallelism without problem in practical use is obtained. Thus, in particular, since the phosphor element 5 is always located on the optical axis Cp, light after passing through the projection lens 6 is parallel to the optical axis Cp.

The fluorescence generation portions 52 and 53 of the first and second modifications described in the first embodiment may be applied to the second embodiment, and the same effects can be obtained.

Third Embodiment

Figure 13:
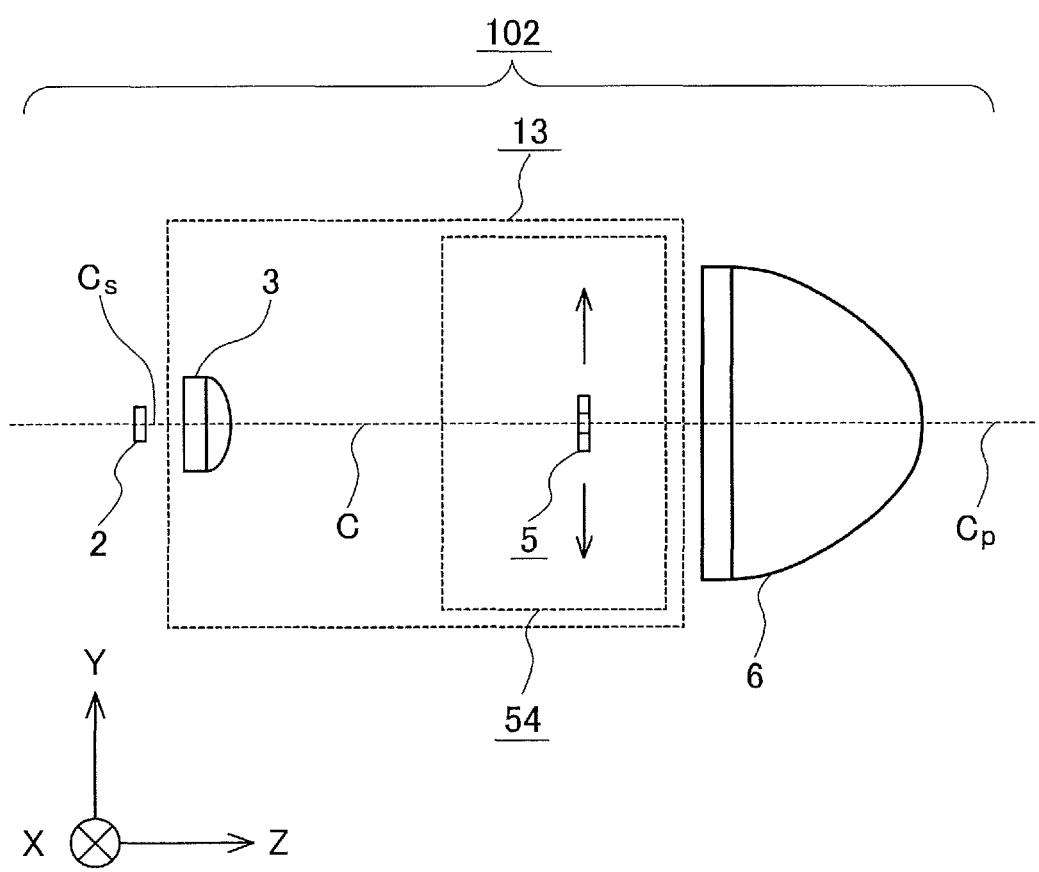
FIG. 13 is a configuration diagram schematically illustrating the main components of a headlight device 102 of a third embodiment of the present invention.

FIG. 13 is a configuration diagram schematically illustrating the main components of a headlight device 102 of the third embodiment of the present invention.

As illustrated in FIG. 13, the headlight device 102 includes a light source 2, a wavelength selection portion 13, and a projection lens 6. The wavelength selection portion 13 includes a condensing lens 3 and a fluorescence generation portion 54. The fluorescence generation portion 54 includes a phosphor element 5.

An example of the embodiment of the present invention will be described with reference to drawings by taking, as an example, a headlight device for a vehicle as in the first embodiment. To facilitate explanation, the embodiment will be described below using XYZ-coordinates that are the same as those of the first embodiment.

Elements that are the same as those of the first embodiment will be given the same reference characters, and descriptions thereof will be omitted. The light source 2 and projection lens 6 are the same as those of the first embodiment.

The fluorescence generation portion 54 differs from the fluorescence generation portion 51 of the first embodiment, but the phosphor element 5 itself provided in the fluorescence generation portion 54 is the same as that of the first embodiment. Thus, in the third embodiment, the reference character 5 is used as in the first embodiment. However, as described later, unlike the first embodiment, the phosphor element 5 is movably held.

The condensing lens 3 itself is the same as that of the first embodiment. Thus, in the third embodiment, the reference character 3 is used as in the first embodiment. However, as described later, unlike the first embodiment, the condensing lens 3 is fixed. For example, the condensing lens 3 is fixed in a direction perpendicular to the optical axis C; or the condensing lens 3 is fixed in a rotational direction about an axis perpendicular to the optical axis C.

For the configurations, functions, operations, or the like of the elements that are the same as those of the first or second embodiment, even when their descriptions are omitted in the third embodiment, the descriptions in the first or second embodiment is substituted. Descriptions regarding the first or second embodiment described in the third embodiment are used as descriptions of the first embodiment. Here, "operation" includes the behavior of light.

<Light Source 2>

The light source 2 emits light that serves as excitation light. The light source 2 is a light source for excitation.

As described above, the light source 2 is the same as that of the first embodiment, so a description thereof will be omitted by substituting the description in the first embodiment.

<Wavelength Selection Portion 13>

The wavelength selection portion 13 selects wavelengths of fluorescence emitted by the phosphor. The wavelength selection portion 13 emits the selected fluorescence as projection light. In the example of FIG. 13, the wavelength selection portion 13 includes the condensing lens 3 and fluorescence generation portion 54.

<Condensing Lens 3>

The condensing lens 3 concentrates light emitted from the light source 2.

As described above, the condensing lens 3 itself is the same as that of the first embodiment, so a description thereof will be omitted by substituting the description in the first embodiment.

<Fluorescence Generation Portion 54>

The fluorescence generation portion 54 includes the phosphor element 5 that is the same as that of the first embodiment. Thus, for the phosphor element 5 itself, a description thereof will be omitted by substituting the description in the first embodiment.

The phosphor element 5 can move in a direction perpendicular to the optical axis C. For example, in FIG. 13, the direction perpendicular to the optical axis C is the Y axis direction.

For example, the position of the phosphor element 5 at which a central axis of the phosphor element 5 coincides with the optical axis C of the condensing lens 3 is taken as a reference position of the phosphor element 5. The reference position of the phosphor element 5 is a position where the region 5a is on the optical axis C.

In the first and second embodiments, the light concentration position of the excitation light on the phosphor element 5 is shifted by moving the condensing lens 3. On the other hand, in the third embodiment, the light concentration position of the excitation light on the phosphor element 5 is shifted by moving the phosphor element 5 with the condensing lens 3 fixed. In this point, the third embodiment differs from the first and second embodiments.

In the first and second embodiments, the condensing lens 3 is moved relative to the phosphor element 5. On the other hand, in the third embodiment, the phosphor element 5 is moved relative to the condensing lens 3.

<Projection Lens 6>

The projection lens 6 projects fluorescence emitted by the fluorescence generation portion 54, in the +Z axis direction. The projection lens 6 projects a light distribution pattern formed at a focal position of the projection lens 6 in a direction of the optical axis Cp of the projection lens 6, in the forward direction. The projection lens 6 is the same as that of the first embodiment, so a description thereof will be omitted by substituting the description in the first embodiment.

<Operation of Headlight Device 102>

The operation of the headlight device 102 will now be described.

The phosphor element 5 shifts, for example, in the Y axis direction.

When the phosphor element 5 is shifted in the +Y axis direction, light emitted from the condensing lens 3 concentrates on the region 5c.

When the phosphor element 5 is shifted in the −Y axis direction, light emitted from the condensing lens 3 concentrates on the region 5b.

When the phosphor element 5 is not shifted from the reference position, light emitted from the condensing lens 3 concentrates on the region 5a. That is, when the phosphor element 5 is located at the reference position, light emitted from the condensing lens 3 concentrates on the region 5a.

The amount of shift of the phosphor element 5 in the Y axis direction is set so that the regions 5a, 5b, and 5c of the phosphor element 5 are on the optical axis C.

Lights emitted from the regions 5a, 5b, and 5c are located on the optical axis Cp of the projection lens 6. Thus, the lights are parallel to the optical axis Cp after passing through the projection lens 6.

Thus, constraint conditions, such as increasing the distance from the phosphor element 5 to the projection lens 6, are eased.

As described in the first and second embodiments, in the first and second embodiments, light emitted from the projection lens 6 is not strictly parallel to the optical axis Cp. However, in the third embodiment, light emitted from the projection lens 6 is parallel to the optical axis Cp.

The first and second modifications described in the first embodiment can be applied to the third embodiment, and the same effects can be obtained.

That is, the combination of the wavelength selection element 700 and phosphor element 5 in the fluorescence generation portion 52 can be applied to the phosphor element 5 of the third embodiment. The combination of the wavelength selection element 7 and phosphor element 53a in the fluorescence generation portion 53 can be applied to the phosphor element 5 of the third embodiment.

With the above operation, when the phosphor element 5 is at the reference position and the region 5a is on the optical axis C, excitation light emitted from the light source 2 concentrates on the region 5a. When the phosphor element 5 is shifted from the reference position in the +Y axis direction and the region 5c is on the optical axis C, excitation light emitted from the light source 2 concentrates on the region 5c. When the phosphor element 5 is moved from the reference position in the −Y axis direction and the region 5b is on the optical axis C, excitation light emitted from the light source 2 concentrates on the region 5b.

By shifting the phosphor element 5 in the Y axis direction with respect to the optical axis C, it is possible to change the region on the phosphor element 5 on which excitation light emitted from the condensing lens 3 is concentrated, between the regions 5a, 5b, and 5c. This makes it possible to switch between the three color temperatures. Further, no mixture of lights having different color temperatures occurs, and thus occurrence of color unevenness of light emitted from the projection lens 6 is prevented.

The number of regions of the phosphor element 5 is not limited and may be two or four. In particular, since the phosphor element 5 is always located on the optical axis Cp, light after passing through the projection lens 6 is parallel to the optical axis Cp.

Fourth Embodiment

Figure 14:
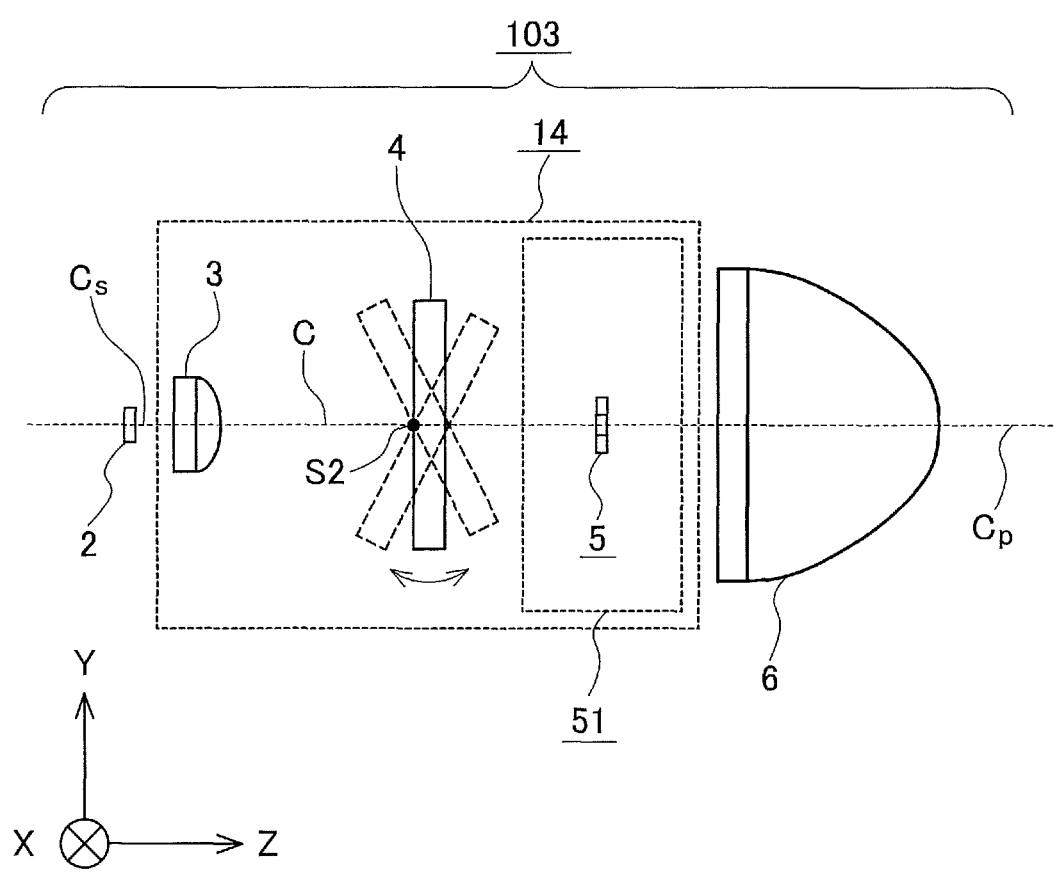
FIG. 14 is a configuration diagram schematically illustrating the main components of a headlight device 103 of a fourth embodiment of the present invention.

FIG. 14 is a configuration diagram schematically illustrating the main components of a headlight device 103 of the fourth embodiment of the present invention.

As illustrated in FIG. 14, the headlight device 103 includes a light source 2, a condensing lens 3, a transmission element 4, and a projection lens 6. The headlight device 103 may include a fluorescence generation portion 51. The fluorescence generation portion 51 includes a phosphor element 5. The fluorescence generation portion 51 is provided in a wavelength selection portion 14. The condensing lens 3 and transmission element 4 are also provided in the wavelength selection portion 14.

An example of the embodiment of the present invention will be described with reference to drawings by taking, as an example, a headlight device for a vehicle as in the first embodiment. To facilitate explanation, the embodiment will be described below using XYZ-coordinates that are the same as those of the first embodiment.

Elements that are the same as those of the first embodiment will be given the same reference characters, and descriptions thereof will be omitted. The light source 2, fluorescence generation portion 51, and projection lens 6 are the same as those of the first embodiment.

The phosphor element 5 provided in the fluorescence generation portion 51 is also the same as that of the first embodiment.

The condensing lens 3 itself is the same as that of the first embodiment. Thus, in the third embodiment, the reference character 3 is used as in the first embodiment. However, as described later, unlike the first embodiment, the condensing lens 3 is fixed. The condensing lens 3 is fixed as in the third embodiment.

For the configurations, functions, operations, or the like of elements that are the same as those of one of the first to third embodiments, even when their descriptions are omitted in the fourth embodiment, the descriptions in the first to third embodiments are substituted. Descriptions regarding the first to third embodiments described in the fourth embodiment are used as descriptions of the first to third embodiments, respectively. Here, "operation" includes the behavior of light.

<Light Source 2>

The light source 2 emits light that serves as excitation light. The light source 2 is a light source for excitation.

As described above, the light source 2 is the same as that of the first embodiment, so a description thereof will be omitted by substituting the description in the first embodiment.

<Wavelength Selection Portion 14>

The wavelength selection portion 14 selects wavelengths of fluorescence emitted by the phosphor. The wavelength selection portion 14 emits the selected fluorescence as projection light. In the example of FIG. 14, the wavelength selection portion 14 includes the condensing lens 3, transmission element 4, and fluorescence generation portion 51.

<Condensing Lens 3>

The condensing lens 3 concentrates light emitted from the light source 2.

As described above, the condensing lens 3 itself is the same as that of the first embodiment, so a description thereof will be omitted by substituting the description in the first embodiment. The condensing lens 3 is fixed relative to the light source 2, as in the third embodiment.

<Transmission Element 4>

The transmission element 4 changes the traveling direction of excitation light emitted from the condensing lens 3.

The transmission element 4 is, for example, a plate-like optical element. In the fourth embodiment, the transmission element 4 is described as a parallel plate. A transmission element having a light incident surface and a light emitting surface inclined to the light incident surface may be employed.

The transmission element 4 swings about an axis S2 parallel to the X axis. For example, in FIG. 14, as viewed from the −X axis direction side, the transmission element 4 can turn by a predetermined angle clockwise or counterclockwise about the axis S2. The axis S2 is, in other words, a second axis perpendicular to the optical axis C.

In FIG. 14, for example, the axis S2 orthogonally intersects with the optical axis C. "Orthogonally intersects"

refers to intersecting at a right angle. In FIG. 14, as viewed in the X axis direction, the axis S2 is on the optical axis C.

In FIG. 14, the axis S2 is located on an incident surface of the transmission element 4. However, it may be located on an emitting surface of the transmission element 4.

The material of the transmission element 4 is, for example, glass having a refractive index of 1.52. It is not limited to glass and may be any refractive material. However, in view of light use efficiency, it preferably has high transmittance.

<Fluorescence Generation Portion 51>

The fluorescence generation portion 51 is the same as that of the first embodiment, so a description thereof will be omitted by substituting the description in the first embodiment.

As in the case where the condensing lens 3 is at the reference position in the first embodiment, the region 5a is located on the optical axis C of the condensing lens 3. The region 5b is located, for example, on the +Y axis direction side of the optical axis C. The region 5c is located, for example, on the −Y axis direction side of the optical axis C. The reference position of the condensing lens 3 in the first embodiment is the position in the state where the condensing lens 3 is not turned in the first embodiment.

<Projection Lens 6>

The projection lens 6 projects fluorescence emitted by the phosphor element 5, in the +Z axis direction. The projection lens 6 is the same as that of the first embodiment, so a description thereof will be omitted by substituting the description in the first embodiment.

<Operation of Headlight Device 103>

The operation of the headlight device 103 will now be described.

Figure 15A:
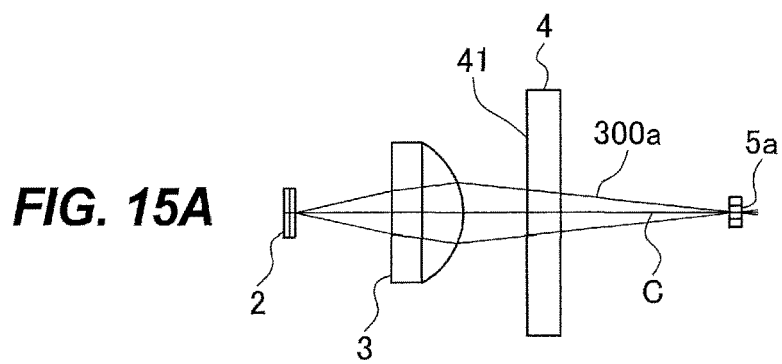
FIGS. 15A, 15B, and 15C are explanatory diagrams illustrating simulation results of light ray tracking that indicate effects of the present invention.
Figure 15B:
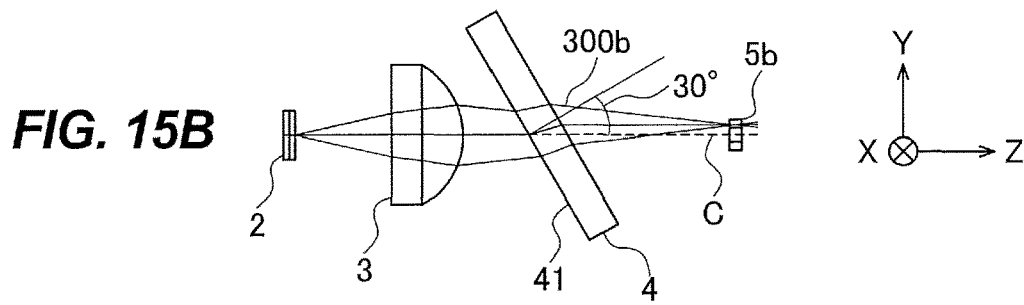
Figure 15C:
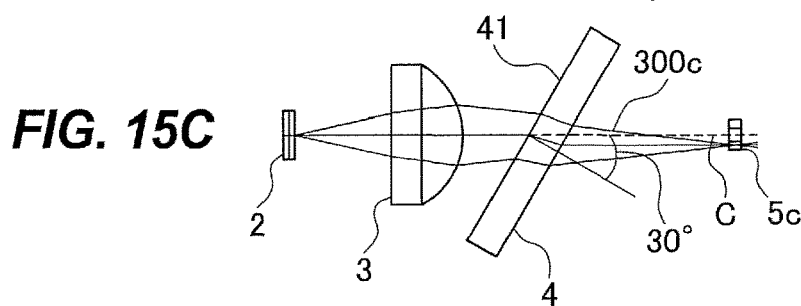

FIGS. 15A, 15B, and 15C are results of light ray tracking simulation for explaining the operation of the headlight device 103 of the fourth embodiment.

In FIG. 15A, the transmission element 4 is perpendicular to the optical axis C.

In FIG. 15B, the transmission element 4 is turned counterclockwise from the state of FIG. 15A, as viewed from the −X axis direction side.

In FIG. 15C, the transmission element 4 is turned clockwise from the state of FIG. 15A, as viewed from the −X axis direction side.

In each of FIGS. 15B and 15C, the turning angle is 30 degrees, which is an example.

FIGS. 15A, 15B, and 15C show different optical paths. The light rays in FIG. 15A will be referred to as the light rays 300a. The light rays in FIG. 15B will be referred to as the light rays 300b. The light rays in FIG. 15C will be referred to as the light rays 300c. FIGS. 15A, 15B, and 15C show light rays 300a, 300b, and 300c emitted from a center of the light source 2.

Light emitted from the light source 2 travels in the +Z axis direction with an emission angle centered on the optical axis C.

The light traveling in the +Z axis direction is incident on the condensing lens 3.

The light incident on the condensing lens 3 is concentrated.

In the case of FIG. 15A, an incident surface 41 of the transmission element 4 is perpendicular to the optical axis C. Of the light rays 300a, the light ray on the optical axis C travels without being refracted at the incident surface 41. Thus, the light concentration position of the light rays 300a is on the optical axis C. In FIG. 15A, the light rays 300a concentrate on the region 5a of the phosphor element 5.

In the case of FIG. 15B, the incident surface 41 of the transmission element 4 is turned counterclockwise by 30 degrees with respect to the optical axis C, as viewed from the −X axis direction side. Of the light rays 300b, the light ray on the optical axis C is refracted at the incident surface 41 in the +Y axis direction and travels. Thus, the light concentration position of the light rays 300b is shifted in the +Y axis direction with respect to the optical axis C. In FIG. 15B, the light rays 300b concentrate on the region 5b of the phosphor element 5.

In the case of FIG. 15C, the incident surface 41 of the transmission element 4 is turned clockwise by 30 degrees with respect to the optical axis C, as viewed from the −X axis direction side. Of the light rays 300c, the light ray on the optical axis C is refracted at the incident surface 41 in the −Y axis direction and travels. Thus, the light concentration position of the light rays 300c is shifted in the −Y axis direction with respect to the optical axis C. In FIG. 15C, the light rays 300c concentrate on the region 5c of the phosphor element 5.

With the above operation, when the incident surface 41 of the transmission element 4 is perpendicular to the optical axis C, the light rays 300a emitted from the light source 2 concentrate on the region 5a of the phosphor element 5. When the incident surface 41 of the transmission element 4 is turned counterclockwise with respect to the optical axis C as viewed from the −X axis direction side, the light rays 300b emitted from the light source 2 concentrate on the region 5b of the phosphor element 5. When the incident surface 41 of the transmission element 4 is turned clockwise with respect to the optical axis C as viewed from the −X axis direction side, the light rays 300c emitted from the light source 2 concentrate on the region 5c of the phosphor element 5.

By swinging the transmission element 4, it is possible to shift the light concentration position on the phosphor element 5 of excitation light emitted from the condensing lens 3. This makes it possible to switch between the three color temperatures. Further, no mixture of lights having different color temperatures occurs, and thus occurrence of color unevenness of light emitted from the projection lens 6 is prevented.

The optimum turning angles for concentrating light on the respective regions 5a, 5b, and 5c of the phosphor element 5 depend on the thickness or refractive index of the transmission element 4. Also, the optimum turning angles for concentrating light on the respective regions 5a, 5b, and 5c of the phosphor element 5 depend on the positions of the regions 5a, 5b, and 5c.

In the above description, the light rays 300a, 300b, and 300c respectively concentrate on the regions 5a, 5b, and 5c of the phosphor element 5. However, the light concentration positions of the light rays 300a, 300b, and 300c need not necessarily be on the phosphor element 5. That is, the light concentration positions of the light rays 300a, 300b, and 300c may be shifted in a direction of the optical axis C with respect to the phosphor element 5. It is sufficient that light beams of the light rays 300a, 300b, and 300c respectively arrive in the regions 5a, 5b, and 5c. That is, it is sufficient that the spot diameters of the light rays 300a, 300b, and 300c respectively fall within the regions 5a, 5b, and 5c.

Advantages of the fourth embodiment will now be described.

By adjusting the turning angle of the transmission element 4, it is possible to emit light having different color temperatures from the projection lens 6. Further, no mixture of lights of different colors occurs, and thus color temperature unevenness can be reduced. It can be implemented by the simple operation of turning the transmission element 4, which facilitates the downsize of the device. Further, since the operation is simple, the driving mechanism can be easily simplified, and the cost can be reduced due to reduction in the number of parts or improvement in ease of assembly.

From the above, it is possible to provide the headlight device that can select different color temperatures by adjusting the turning angle of the transmission element 4, and prevents occurrence of color unevenness of light emitted from the projection lens 6.

The position of the transmission element 4 is preferably between the condensing lens 3 and the phosphor element 5. The light rays 300a, 300b, and 300c emitted from the light source 2 are concentrated by the condensing lens 3. Thus, the transmission element 4 can be implemented by a small component.

The first or second modification described in the first embodiment can be applied to the fourth embodiment, and the same effects can be obtained.

That is, the combination of the wavelength selection element 700 and phosphor element 5 in the fluorescence generation portion 52 can be applied to the phosphor element 5 of the fourth embodiment. The combination of the wavelength selection element 7 and phosphor element 53a in the fluorescence generation portion 53 can be applied to the phosphor element 5 of the fourth embodiment.

Figure 17:
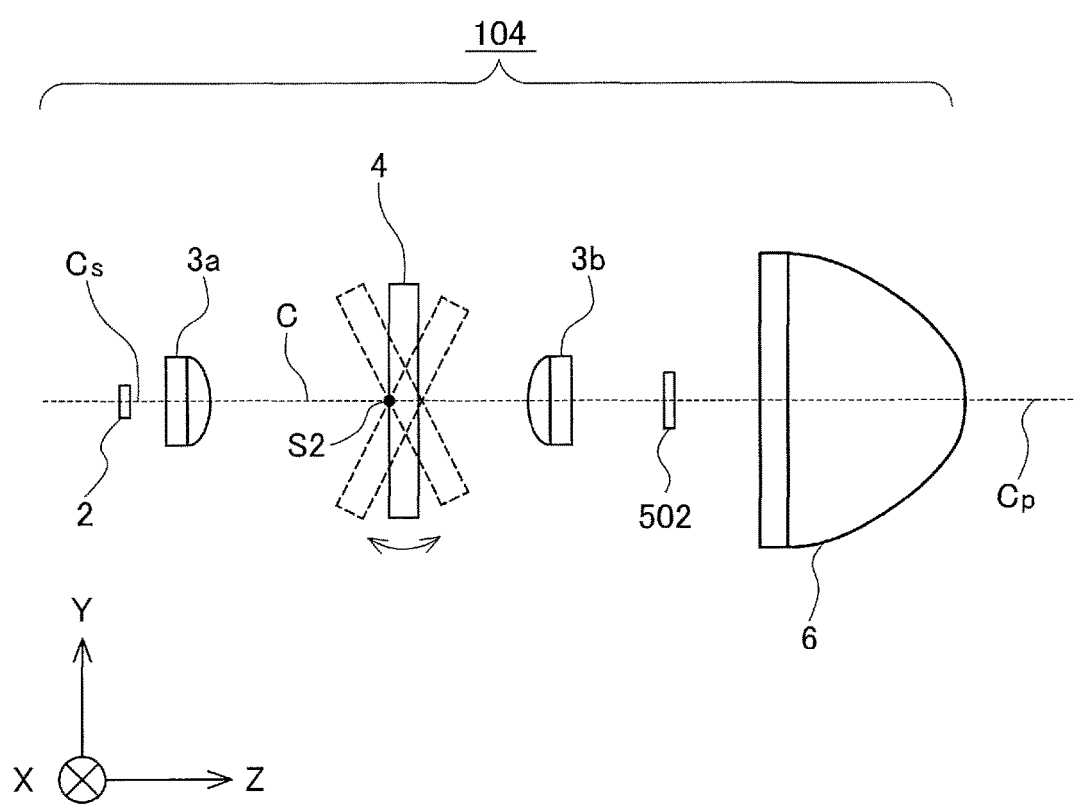
FIG. 17 is a schematic configuration diagram of a headlight device 104 that illustrates another exemplary configuration.

FIG. 17 illustrates a configuration in which a condensing lens 3b is disposed between a transmission element 4 and a phosphor element 502. FIG. 17 is a configuration diagram of a headlight device 104 that schematically illustrates an exemplary configuration in which parallel light is incident on the transmission element 4.

The headlight device 104 includes a collimating lens 3a between a light source 2 and the transmission element 4. The headlight device 104 also includes the condensing lens 3b between the transmission element 4 and the phosphor element 502.

The collimating lens 3a collimates light emitted from the light source 2 into parallel light. The condensing lens 3b concentrates parallel light passing through the transmission element 4.

In this case, light emitted from the light source 2 is collimated by the collimating lens 3a and reaches the transmission element 4. Then, parallel light emitted from the collimating lens 3a is shifted in the Y axis direction depending on turn of the transmission element 4 about an axis S2, and reaches the condensing lens 3b.

The condensing lens 3b concentrates the incident parallel light on the optical axis C of the condensing lens 3b. Thus, regardless of turn of the transmission element 4, light rays 300a, 300b, and 300c concentrate on the optical axis C. Thus, it is not possible to cause the light rays 300b to reach the region 5b. Also, it is not possible to cause the light rays 300c to reach the region 5c. It is not possible to change the color temperature of light projected from the headlight device.

Fifth Embodiment

Figure 18:
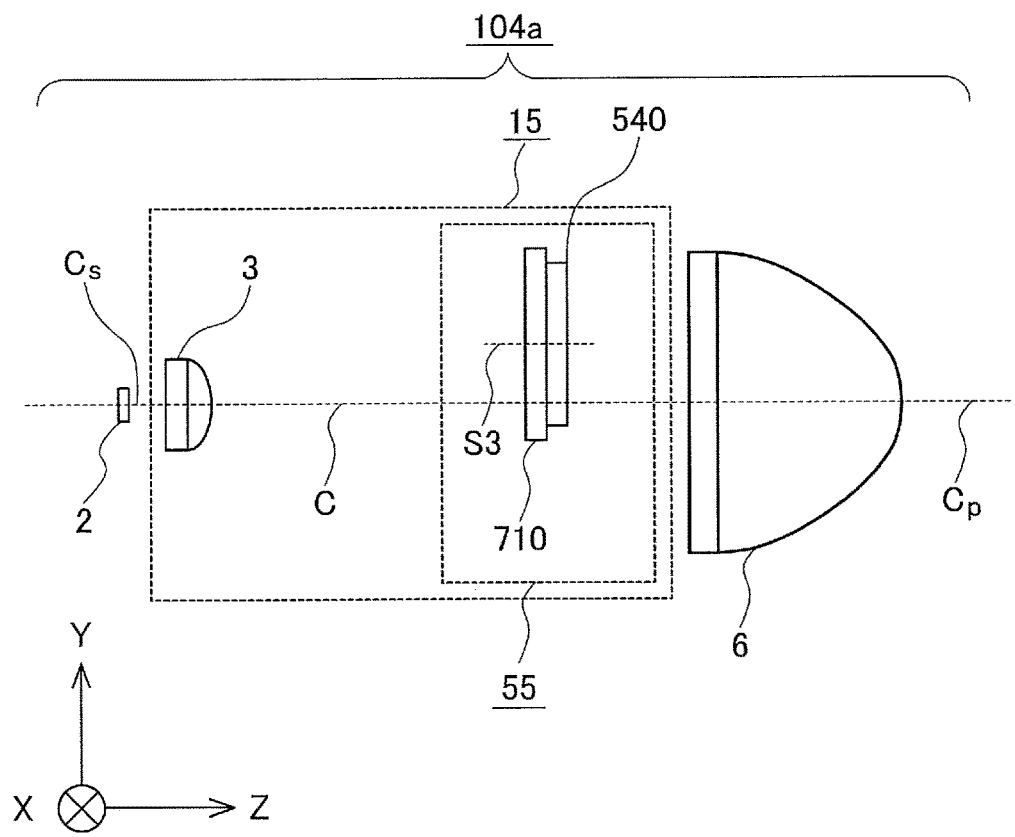
FIG. 18 is a configuration diagram schematically illustrating the main components of a headlight device 104a of a fifth embodiment of the present invention.

FIG. 18 is a configuration diagram schematically illustrating the main components of a headlight device 104a of the fifth embodiment of the present invention.

As illustrated in FIG. 18, the headlight device 104a includes a light source 2, a wavelength selection portion 15, and a projection lens 6. The wavelength selection portion 15 includes a condensing lens 3 and a fluorescence generation portion 55. The fluorescence generation portion 55 includes a phosphor element 540. The fluorescence generation portion 55 may include a wavelength selection element 710.

An example of the embodiment of the present invention will be described with reference to drawings by taking, as an example, a headlight device for a vehicle as in the first embodiment. To facilitate explanation, the following description of the embodiment will be made using XYZ-coordinates that are the same as those of the first embodiment.

Elements that are the same as those of the first embodiment will be given the same reference characters, and descriptions thereof will be omitted. The light source 2 and projection lens 6 are the same as those of the first embodiment.

The condensing lens 3 itself is the same as that of the first embodiment. Thus, in the fifth embodiment, the reference character 3 is used as in the first embodiment. However, as described later, unlike the first embodiment, the condensing lens 3 is fixed. As in the third embodiment, the condensing lens 3 is fixed.

For the configurations, functions, operations, or the like of elements that are the same as those of one of the first to fourth embodiments, even when their descriptions are omitted in the fifth embodiment, the descriptions in the first to fourth embodiments are substituted. Descriptions regarding the first to fourth embodiments described in the fifth embodiment are used as descriptions of the first to fourth embodiments, respectively. Here, "operation" includes the behavior of light.

<Light Source 2>

The light source 2 emits light that serves as excitation light. The light source 2 is a light source for excitation.

As described above, the light source 2 is the same as that of the first embodiment, so a description thereof will be omitted by substituting the description in the first embodiment.

<Wavelength Selection Portion 15>

The wavelength selection portion 15 selects wavelengths of fluorescence emitted by the phosphor. The wavelength selection portion 15 emits the selected fluorescence as projection light. The wavelength selection portion 15 includes the condensing lens 3 and fluorescence generation portion 55.

<Condensing Lens 3>

The condensing lens 3 concentrates light emitted from the light source 2.

As described above, the condensing lens 3 itself is the same as that of the first embodiment, so a description thereof will be omitted by substituting the description in the first embodiment. The condensing lens 3 is fixed relative to the light source 2, as in the third embodiment.

As in the case where the condensing lens 3 is at the reference position in the first embodiment, the optical axis C of the condensing lens 3 coincides with the optical axis Cp of the projection lens 6.

<Fluorescence Generation Portion 55>

The fluorescence generation portion 55 includes the wavelength selection element 710 and phosphor element 540.

The wavelength selection element 710 and phosphor element 540 turns about an axis S3. The axis S3 is, for example, parallel to the Z axis. That is, the axis S3 is, for example, parallel to the optical axis C. The axis S3 is, for example, parallel to the optical axis Cp.

The wavelength selection element 710 is located on the condensing lens 3 side of the phosphor element 540. The phosphor element 540 is located on the +Z axis direction side of the wavelength selection element 710. The phosphor element 540 is located on the projection lens 6 side of the wavelength selection element 710.

The wavelength selection element 710 includes, for example, a glass substrate with a coating having a wavelength selection characteristic applied thereto.

The phosphor element 540 is, for example, applied to a light incident surface side or a light emitting surface side of the wavelength selection element 710. The phosphor element 540 is, for example, applied concentrically.

In FIG. 18, the wavelength selection element 710 is integrated with the phosphor element 540.

Figure 19:
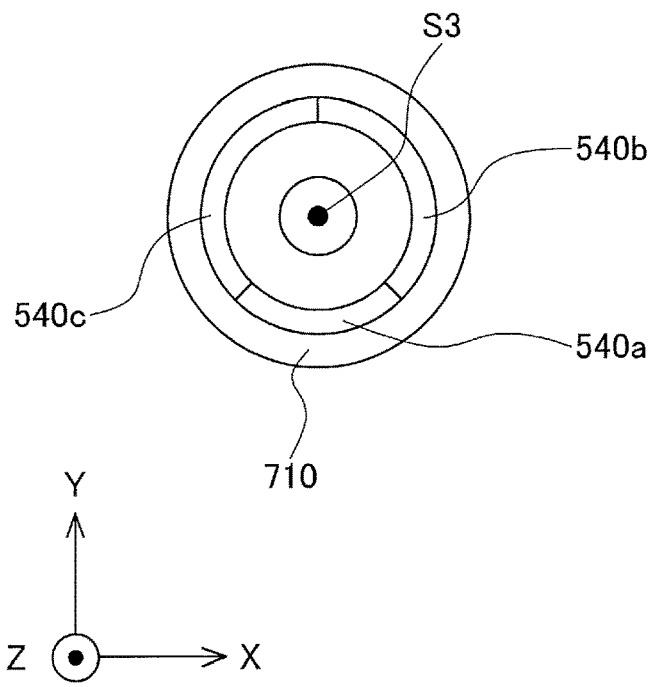
FIG. 19 is a schematic diagram of a circular plate of the fifth embodiment.

FIG. 19 is a schematic diagram of the wavelength selection element 710 and phosphor element 540 of the fifth embodiment. FIG. 19 is a diagram of the wavelength selection element 710 and phosphor element 540 as viewed from the +Z axis side.

The phosphor element 540 is, for example, divided into three regions in a circumferential direction, as illustrated in FIG. 19.

For example, the phosphor element 540 includes regions 540a, 540b, and 540c. The phosphor element 540 includes the regions 540a, 540b, and 540c divided radially about the axis S3. Thus, the regions 540a, 540b, and 540c have fan shapes. Central angles of the fan shapes are, for example, 120 degrees.

The region 540a emits fluorescence having a color temperature of, for example, 6000 K. The region 540b emits fluorescence having a color temperature of, for example, 4000 K. The region 540c emits fluorescence having a color temperature of, for example, 2500 K.

The regions 540a, 540b, and 540c are arranged so that each of the regions 540a, 540b, 540c is located on the optical axis C due to turning of them. The phosphor element 540 is turned so that the regions 540a, 540b, and 540c are located on the optical axis C.

Thereby, the phosphor element 540 can emit fluorescence of different wavelengths. In this point, it differs from the first embodiment.

The number of regions of the phosphor element 540 is not limited and may be two or four. In particular, the phosphor element 540 is always located on the optical axis Cp. Thus, after passing through the projection lens 6, fluorescence emitted from the phosphor element 540 is light parallel to the optical axis Cp.

Thus, light emitted from the regions 540a, 540b, and 540c is parallel to the optical axis Cp after passing through the projection lens 6.

The diameter of concentrated light on the phosphor element 540 is, for example, 0.5 mm.

Further, the fifth embodiment includes the wavelength selection element 710. The phosphor element 540 is applied on the wavelength selection element 710. However, the phosphor element 540 may be applied on a glass substrate having no wavelength selection characteristic.

<Projection Lens 6>

The projection lens 6 projects fluorescence emitted by the fluorescence generation portion 55, in the +Z axis direction. The projection lens 6 is the same as that of the first embodiment, so a description thereof will be omitted by substituting the description in the first embodiment.

<Operation of Headlight Device 104a>

The operation of the headlight device 104a will now be described.

The phosphor element 540 turns about the axis S3. The axis S3 is, for example, parallel to the optical axis C.

When the region 540a of the phosphor element 540 is located on the optical axis C, light emitted from the condensing lens 3 concentrates on the region 540a. When the region 540b of the phosphor element 540 is located on the optical axis C, light emitted from the condensing lens 3 concentrates on the region 540b. When the region 540c of the phosphor element 540 is located on the optical axis C, light emitted from the condensing lens 3 concentrates on the region 540c.

The turning angle of the phosphor element 540 is set so that the regions 540a, 540b, and 540c of the phosphor element 540 are located on the optical axis C.

Light emitted from the regions 540a, 540b, and 540c is located on the optical axis Cp. Thus, light rays after passing through the projection lens 6 are parallel to the optical axis Cp.

Thus, constraint conditions, such as increasing the distance from the phosphor element 540 to the projection lens 6, are eased.

With the above operation, when the region 540a of the phosphor element 540 is located on the optical axis C, excitation light emitted from the light source 2 concentrates on the region 540a. When the region 540b of the phosphor element 540 is located on the optical axis C, excitation light emitted from the light source 2 concentrates on the region 540b. When the region 540c of the phosphor element 540 is located on the optical axis C, excitation light emitted from the light source 2 concentrates on the region 540c.

By turning the phosphor element 540 about the axis S3, it is possible to change the region on the optical axis C of the phosphor element 540 between the regions 540a, 540b, and 540c and concentrate excitation light emitted from the condensing lens 3 on it.

This makes it possible to switch between the three color temperatures. Further, no mixture of lights having different color temperatures occurs, and thus occurrence of color unevenness of light emitted from the projection lens 6 is prevented.

<Third Modification>

Figure 20:
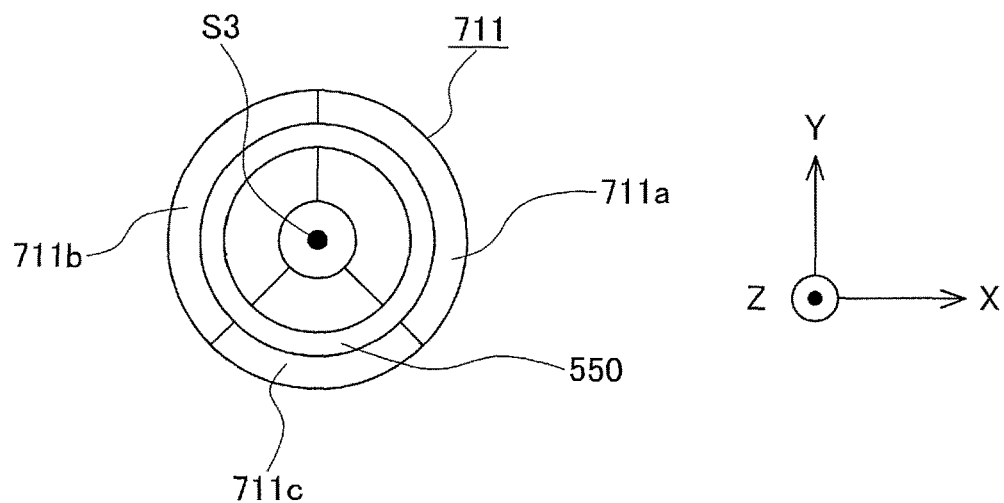
FIG. 20 is a schematic diagram of a circular plate of a third modification.

FIG. 20 is a schematic diagram of a wavelength selection element 711 and a phosphor element 550 of a third modification. FIG. 20 is a diagram of the wavelength selection element 711 and phosphor element 550 as viewed from the +Z axis side. Since only the wavelength selection element 711 and phosphor element 550 in the fluorescence generation portion 55 are different from those of the headlight device 104a illustrated in FIG. 18, only the differences from the headlight device 104a illustrated in FIG. 18 will be described.

The fluorescence generation portion 55 includes the wavelength selection element 711 instead of the wavelength selection element 710. Further, the fluorescence generation portion 55 includes the phosphor element 550 instead of the phosphor element 540.

The wavelength selection element 711 and phosphor element 550 turn about the axis S3. The axis S3 is, for example, parallel to the Z axis. That is, the axis S3 is, for example, parallel to the optical axis C. The axis S3 is, for example, parallel to the optical axis Cp.

The phosphor element 550 is located on the +Z axis direction side of the wavelength selection element 711.

The wavelength selection element 711 includes, for example, a glass substrate to which a coating having a wavelength selection characteristic is applied. The coating having the wavelength selection characteristic may be applied to the +Z axis side or −Z axis side of the wavelength selection element 711.

Regions 711a, 711b, and 711c may have the same wavelength selection characteristics as the regions 7a, 7b, and 7c described in the second modification of the first embodiment. This makes it possible to emit light having the same wavelengths as that in the second modification of the first embodiment.

The phosphor element 550 is, for example, applied to a light incident surface side of the wavelength selection element 711. That is, the phosphor element 550 is applied on a surface on the +Z axis direction side of the wavelength selection element 711. In FIG. 20, the phosphor element 550 is applied on the wavelength selection element 711 concentrically with respect to the axis S3.

In FIG. 20, the phosphor element 550 is, for example, applied directly on the surface on the +Z axis direction side of the wavelength selection element 711. Thus, the wavelength selection element 711 is integrated with the phosphor element 550.

In the third modification, the phosphor element 550 is formed by a single phosphor.

The wavelength selection element 711 is divided into the regions 711a, 711b, and 711c.

The wavelength selection element 711 is, for example, divided into the three regions in a circumferential direction, as illustrated in FIG. 20.

For example, the wavelength selection element 711 includes the regions 711a, 711b, and 711c divided radially about the axis S3. The regions 711a, 711b, and 711c have fan shapes. The central angles are, for example, 120 degrees.

By turning the wavelength selection element 711 about the axis S3, it is possible to change the region located on the optical axis C between the regions 711a, 711b, and 711c.

When the configuration described in the fifth embodiment is used, it is possible to perform time division control in conjunction with the light source 2.

That is, when an arbitrary one of the regions 540a, 540b, and 540c is located on the optical axis C, light is emitted from the light source 2. In the third modification, when an arbitrary one of the regions 711a, 711b, and 711c is located on the optical axis C, light is emitted from the light source 2.

In the configuration described in the fifth embodiment, it is possible to cause light of different wavelengths emitted from the regions 540a, 540b, and 540c to be incident on the projection lens 6 in a time division manner. In the configuration described in the third modification, it is possible to cause light of different wavelengths emitted from the regions 711a, 711b, and 711c to be incident on the projection lens 6 in a time division manner.

"Time division" refers to alternately executing two or more processes at different times in a single device. Here, the fluorescence generation portion 55 can cause light of different wavelengths to be incident on the projection lens 6 at different times.

This makes it possible to project lights having multiple color temperatures. A central light ray of a light beam incident on the projection lens 6 is located on the optical axis Cp. Thus, light having high parallelism with respect to the optical axis Cp can be emitted from the projection lens 6. Here, "central light ray" refers to a light ray traveling on the optical axis C of the condensing lens 3.

In the third modification, a case where the wavelength selection element 711 is divided into three has been described. However, it need not necessarily be divided into three, and may be divided into two, four, or more.

Sixth Embodiment

Figure 21:
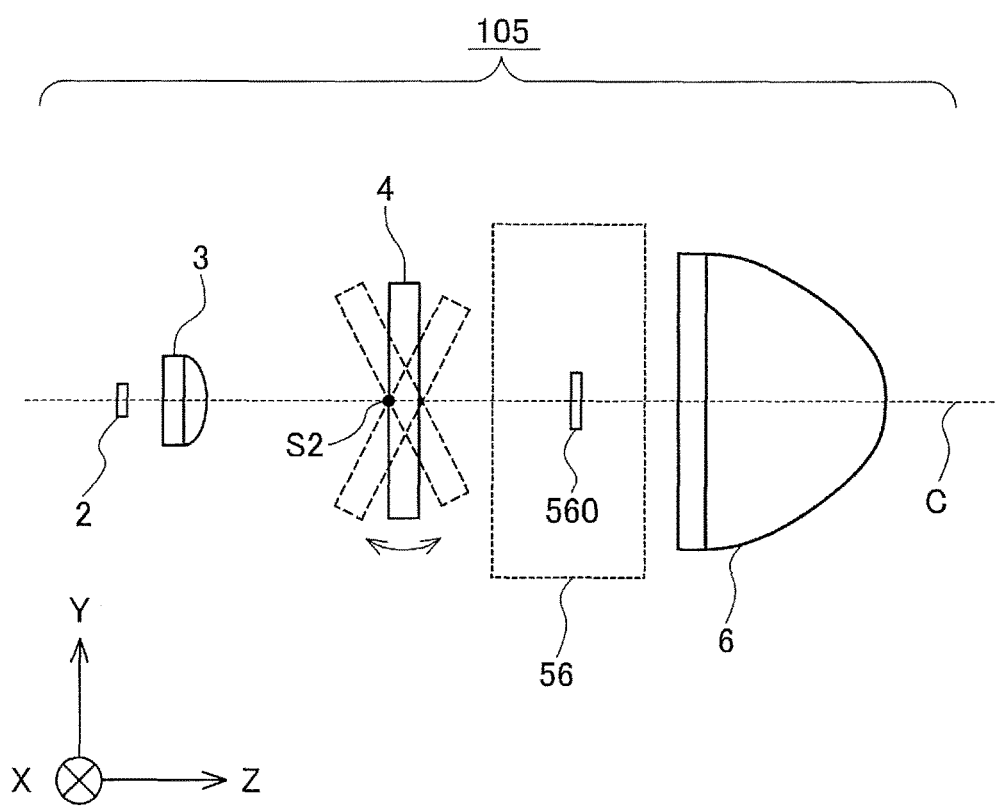
FIG. 21 is a configuration diagram schematically illustrating the main components of a headlight device 105 of a sixth embodiment of the present invention.

FIG. 21 is a configuration diagram schematically illustrating the main components of a headlight device 105 of a sixth embodiment of the present invention.

As illustrated in FIG. 21, the headlight device 105 includes a light source 2, a condensing lens 3, a transmission element 4, and a projection lens 6. The headlight device 105 may include a phosphor element 560. The headlight device 105 may include a fluorescence generation portion 56. The fluorescence generation portion 56 includes the phosphor element 560. The headlight device 105 includes no wavelength selection portion. Thus, the headlight device 105 cannot change the wavelength of the projection light.

An example of the embodiment of the present invention will be described with reference to drawings by taking, as an example, a headlight device for a vehicle as in the first embodiment. To facilitate explanation, the embodiment will be described below using XYZ-coordinates that are the same as those of the first embodiment.

Elements that are the same as those of the first embodiment will be given the same reference characters, and descriptions thereof will be omitted. The light source 2 and projection lens 6 are the same as those of the first embodiment.

The condensing lens 3 itself is the same as that of the first embodiment. Thus, in the sixth embodiment, the reference character 3 is used as in the first embodiment. However, as described later, unlike the first embodiment, the condensing lens 3 is fixed.

The transmission element 4 is the same as the transmission element 4 described in the fourth embodiment. Thus, descriptions overlapping with the descriptions of the fourth embodiment will be omitted in the sixth embodiment by substituting the descriptions of the fourth embodiment.

For the configurations, functions, operations, or the like of elements that are the same as those of one of the first to fifth embodiments, even when their descriptions are omitted in the sixth embodiment, the descriptions in the first to fifth embodiments are substituted. Descriptions regarding the first to fifth embodiments described in the sixth embodiment are used as descriptions of the first to fifth embodiments, respectively. Here, "operation" includes the behavior of light.

As illustrated in FIG. 21, the phosphor element 560 of the headlight device 105 is formed by a single phosphor. The headlight device 105 differs from the headlight device 103 of the fourth embodiment in having the phosphor element 560 instead of the phosphor element 5.

The headlight device 105 of FIG. 21 shifts the light concentration position on the phosphor element 560 of light emitted from the light source 2 in the Y axis direction by swinging the transmission element 4 about the axis S2 as in the fourth embodiment.

Effects of the sixth embodiment will be described.

FIG. 16 will be used as a light ray tracking diagram for explaining effects of the sixth embodiment. The explanation will be made on the assumption that the phosphor element 5 in FIG. 16 is the phosphor element 560.

The phosphor element 560 consists of a single region. Thus, the regions 5a, 5b, and 5c emit lights in the same wavelength band.

Light rays 1400a emitted from the region 5a travel parallel to the optical axis Cp after passing through the projection lens 6. Light rays 1400b emitted from the region 5b travel in the −Y axis direction obliquely to the optical axis Cp after passing through the projection lens 6. Light rays 1400c emitted from the region 5c travel in the +Y axis direction obliquely to the optical axis Cp after passing through the projection lens 6.

Thus, by controlling the position where light rays are emitted from the phosphor element 560, it is possible to control the direction in which the light rays travel. By changing the light emitting region of the phosphor element 560 between the regions 5a, 5b, and 5c, it is possible to control the position irradiated by light.

For example, when a driver travels in a curve, the headlight device 105 can project light emitted from the light source 2 in the traveling direction of the vehicle. The traveling direction of the vehicle is a direction in which the vehicle turns. This makes it possible to improve visibility for the driver with respect to the traveling direction of the vehicle.

The headlight device 105 can shift the position irradiated by light with a simple configuration. The headlight device 105 can control the light distribution.

With this configuration, the headlight device 105 can be used as an adaptive front-lighting system (AFS). The AFS is a light distribution variable headlamp that in cornering on a road at night, detects a steering angle, a vehicle speed, or the like and directs the irradiation direction of the headlamp in the turn direction.

The headlight device 105 can change the light distribution with a simple configuration that swings the transmission element 4. Further, since the headlight device 105 swings the transmission element 4, it allows a light distribution variable headlamp to be downsized.

For example, the headlight device 105 can continuously swing the transmission element 4 in the left-right direction in a reciprocal manner. When a person is present in the forward direction, the headlight device 105 can swing the transmission element 4 so as to avoid an area where the person is present, and project light. The headlight device 105 can also turn off the light source 2 if the projected light reaches an area where the person is present.

With this configuration, the headlight device 105 can be used as an adaptive driving beam (ADB). The ADB is a headlamp system that when a forward vehicle, such as an oncoming vehicle or a preceding vehicle, appears during traveling with a high beam, detects the position of the forward vehicle using an in-vehicle camera, shades only the area, and irradiates the other area with the high beam.

Further, the headlight device 105 can control the light distribution in a direction according to a curve of a road by adjusting the turning angle of the transmission element 4. Further, the headlight device 105 can control the light distribution according to the width of a road by adjusting the turning angle of the transmission element 4.

For example, in a narrow road, the turning angle of the transmission element 4 is made narrow. On the other hand, in a wide road, the turning angle of the transmission element 4 is made wide. This makes it possible to control the light distribution according to the width of a road. By continuously changing the turning angle of the transmission element 4, it is possible to provide a light distribution corresponding to the width of a road.

In the sixth embodiment, light emitted from the condensing lens 3 reaches the transmission element 4. The transmission element 4 is swung about the axis parallel to the X axis. The light concentration position on the phosphor element 560 is shifted in the Y axis direction. By shifting the light emitting position on the phosphor element 560 in the Y axis direction, the light distribution of light emitted from the projection lens 6 is shifted in the Y axis direction.

In the sixth embodiment, a position at which light emitted from the light source 2 arrives is shifted in the Y axis direction, by swinging the transmission element 4 about the axis parallel to the X axis. However, a position at which light emitted from the light source 2 arrives may be shifted in the X axis direction, by swinging the transmission element 4 about an axis parallel to the Y axis.

The condensing lens 3 may be a collimating lens that collimates light emitted from the light source 2. The diameter of a light beam on the phosphor element 560 in this case is greater than the diameter of a light beam in the case of the condensing lens 3. Thus, the parallelism of light emitted from the projection lens 6 decreases. A central luminous intensity of the light distribution pattern decreases. In the case of a high beam that requires high central luminous intensity, it is not preferable that the condensing lens 3 be a collimating lens. However, in the case of a light distribution pattern that illuminates a wide area, it is effective to employ a collimating lens instead of the condensing lens 3.

Further, it is possible to form a single light distribution pattern by using a headlight device employing the condensing lens 3 and a headlight device employing a collimating lens. In this case, the headlight device employing the collimating lens forms the shape of the entire light distribution pattern. The headlight device employing the condensing lens 3 forms a high illuminance region in the entire light distribution pattern.

Further, the condensing lens 3 may consist of two lenses: a collimating lens and a condensing lens. This makes it possible to freely set the distance from the light source 2 to the condensing lens 3. For example, a mirror that folds a light ray can be disposed between the collimating lens and the condensing lens 3. This allows the size of the headlight device 1 in the projection direction (Z axis direction) to be reduced. "Folds a light ray" refers to changing a direction of the light ray by reflection.

When the transmission element 4 is located between the condensing lens 3 and the projection lens 6, the above effects are obtained. However, it is not preferable to locate the transmission element 4 between the phosphor element 560 and the projection lens 6. This is because light (fluorescence) generated by excitation of the phosphor element 560 is emitted from the phosphor element 560, typically in a scattered manner. That is, light emitted from the phosphor element 560 is scattered light. Thus, the spread of light is large. As the distance between the phosphor element 560 and the projection lens 6 increases, the amount of light that is generated by the excitation and reaches the projection lens 6 decreases, and the light use efficiency of the headlight device 1 decreases. In a case where the light use efficiency is within an allowable range, or the like, the transmission element 4 can be located between the phosphor element 560 and the projection lens 6.

It is preferable that the light concentration position of the condensing lens 3 be located on the phosphor element 560. It is preferable that a focal position of the projection lens 6 be located on the phosphor element 560. "On the phosphor element 560" refers to a surface of the phosphor element 560. Thereby, the most concentrated light is converted by the phosphor element 560 into fluorescence, which is emitted. It is possible to increase the parallelism of light emitted from the projection lens 6. When performance degradation or the like may occur due to rise in temperature of the phosphor element 560 or the like, the light concentration position of the condensing lens 3 can be shifted from the surface of the phosphor element 560.

In the sixth embodiment, the headlight device has been described as an example. However, the configuration of the sixth embodiment can be used as an illumination device. For example, the configuration of the sixth embodiment can be used in an illumination device that emits light according to movement of an object. Further, the configuration of the sixth embodiment temporally changes the projection position of the illumination light, thereby improving an illumination rendering effect. An illumination device employing the configuration of the sixth embodiment can provide illumination with a higher rendering effect.

In the above embodiments, the headlight devices capable of changing the color temperature of light have been described. These headlight devices can be used as illumination devices. By temporally changing the color of the projected illumination light, an illumination rendering effect is improved. An illumination device employing the configuration of one of the above embodiments capable of changing the color temperature of light can provide illumination with a higher rendering effect.

Seventh Embodiment

Figure 22:
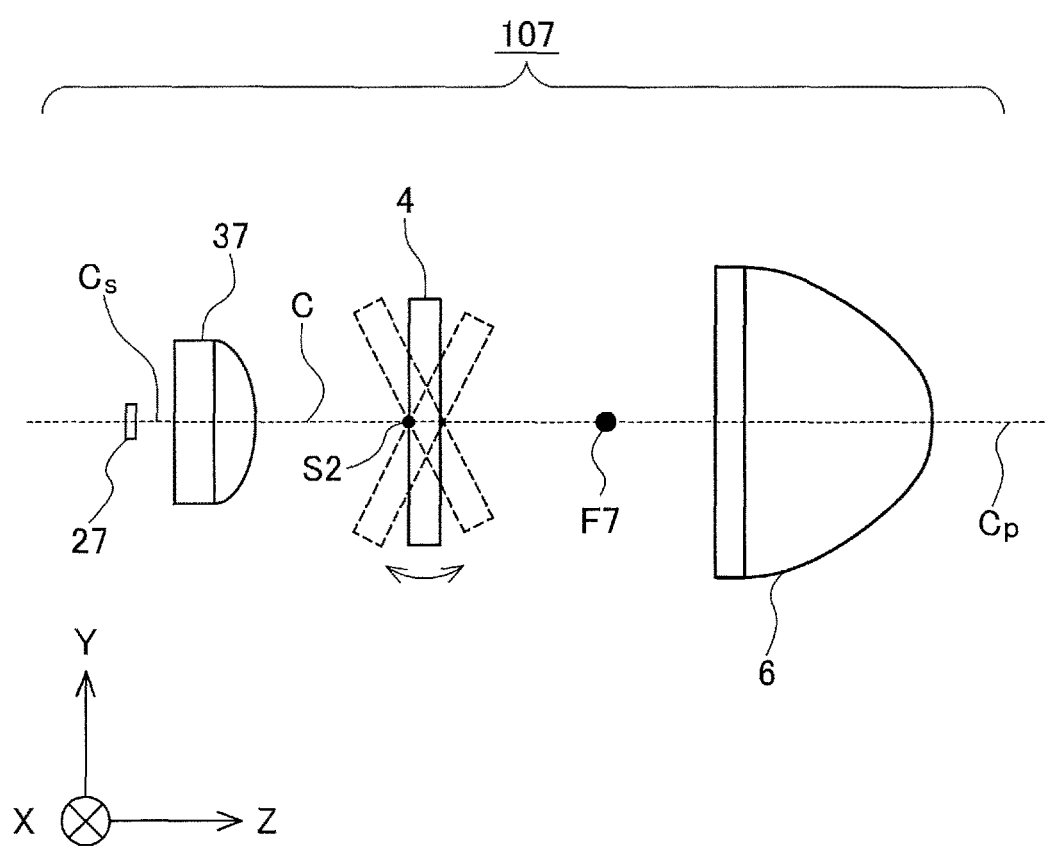
FIG. 22 is a configuration diagram schematically illustrating the main components of a headlight device 107 of a seventh embodiment of the present invention.

FIG. 22 is a configuration diagram schematically illustrating the main components of a headlight device 107 of a seventh embodiment of the present invention.

As illustrated in FIG. 22, the headlight device 107 includes a light source 27, a condensing lens 37, a transmission element 4, and a projection lens 6.

Elements that are the same as those of the first embodiment will be given the same reference characters, and descriptions thereof will be omitted. The projection lens 6 is the same as that of the first embodiment.

The transmission element 4 is the same as the transmission element 4 described in the fourth or sixth embodiment. Thus, descriptions overlapping with the descriptions of the fourth or sixth embodiment will be omitted in the seventh embodiment by substituting the descriptions of the fourth or sixth embodiment.

For the configurations, functions, operations, or the like of elements that are the same as those of one of the first to sixth embodiments, even when their descriptions are omitted in the seventh embodiment, the descriptions in the first to sixth embodiments are substituted. Descriptions regarding the first to sixth embodiments described in the seventh embodiment are used as descriptions of the first to sixth embodiments, respectively. Here, "operation" includes the behavior of light.

The light source 27 emits white light. The light source 27 is a light emitting diode that emits white light. For example, the light source 27 includes a blue light emitting diode and a yellow phosphor. In this case, the light source 27 excites the yellow phosphor using the blue light emitting diode. Alternatively, the light source 27 includes an ultraviolet light emitting diode and a white phosphor. In this case, the light source 27 excites the white phosphor using the ultraviolet light emitting diode.

Unlike the sixth embodiment, the light source 27 is not an excitation light source. The headlight device 107 includes no phosphor element. The headlight device 107 includes no fluorescence generation portion.

The condensing lens 37 may be the same as that of the sixth embodiment. However, the light source 27 has a divergence angle greater than that of the light source 2. Thus, when the light source 27 is the same in size as the light source 2 and light intake efficiency is improved, the condensing lens 37 is larger in size than the condensing lens 3. For this reason, the condensing lens 37 is distinguished from the condensing lens 3 of the sixth embodiment.

The condensing lens 37 concentrates light emitted from the light source 27 at a light concentration point F7. The light concentration point F7 is located between the transmission element 4 and the projection lens 6. In FIG. 22, the light concentration point F7 is located on the optical axis Cp of the projection lens 6.

The condensing lens 37 may be configured using two lenses. This makes it possible to change the distance between the light source 27 and the condensing lens 37. For example, by disposing a mirror that folds a light ray between a collimating lens and a condensing lens, it is possible to downsize the headlight device 107 in a direction (the Z axis direction) of the optical axis of the projection lens 6.

The condensing lens 37 may be configured using a single hybrid lens. The hybrid lens here is, for example, a lens having a light transmission property and a total reflection property. The condensing lens 37 may be an optical element using refraction and total reflection. For example, this optical element can concentrate light having a small divergence angle by refraction and concentrate light having a large divergence angle by total reflection.

The headlight device 107 illustrated in FIG. 22 swings the transmission element 4 about the axis S2, as in the sixth embodiment. Thereby, the headlight device 107 shifts the light concentration point F7 of light emitted from the light source 27 in the Y axis direction. The Y axis direction is a direction perpendicular to a plane including the optical axis Cp and axis S2.

Effects of the seventh embodiment will be described.

FIG. 16 will be used as a light ray tracking diagram for explaining effects of the seventh embodiment. The explanation will be made on the assumption that in FIG. 16, the light concentration point F7 is shifted to the positions of the respective regions 5a, 5b, and 5c on the phosphor element 5. As described above, in the seventh embodiment, the phosphor element 5 is not used.

The light concentration point F7 is a point at which light emitted from the light source 27 concentrates on the optical axis Cp. Thus, when the light concentration point F7 is shifted to the position of each of the regions 5a, 5b, and 5c, light emitted from the light source 27 is emitted from the position of each of the regions 5a, 5b, and 5c.

Light rays 1400a emitted from the position of the region 5a travel parallel to the optical axis Cp after passing through the projection lens 6. Light rays 1400b emitted from the position of the region 5b travel in the −Y axis direction obliquely to the optical axis Cp after passing through the projection lens 6. Light rays 1400c emitted from the position of the region 5c travel in the +Y axis direction obliquely to the optical axis Cp after passing through the projection lens 6.

The direction in which light rays emitted from the light concentration point F7 travel varies depending on the position of the light concentration point F7. Thus, by shifting the position of the light concentration point F7 in the Y axis direction, it is possible to shift the position irradiated by light emitted from the light source 27.

For example, when a driver travels in a curve, the headlight device 107 can project light emitted from the light source 2 in the traveling direction of the vehicle. The traveling direction of the vehicle is a direction in which the vehicle turns. This makes it possible to improve visibility for the driver with respect to the traveling direction of the vehicle.

The headlight device 107 can shift the position irradiated by light with a simple configuration. The headlight device 107 can control the light distribution.

In the seventh embodiment, a position at which light emitted from the light source 27 arrives is shifted in the Y axis direction, by swinging the transmission element 4 about the axis parallel to the X axis. However, the position at which light emitted from the light source 27 arrives may be shifted in the X axis direction, by swinging the transmission element 4 about an axis parallel to the Y axis.

The headlight device 107 of the seventh embodiment causes light emitted from the condensing lens 37 to reach the transmission element 4. The headlight device 107 swings the transmission element 4 about the axis parallel to the X axis. Here, the X axis is an axis perpendicular to the optical axis Cp of the projection lens 6. The headlight device 107 shifts the light concentration point F7 in the Y axis direction. Here, the Y axis is an axis perpendicular to both the optical axis Cp and the X axis. The headlight device 107 shifts the light distribution of light emitted from the projection lens 6, in the Y axis direction, by shifting the light concentration point F7 in the Y axis direction to shift the irradiation position (emission direction) of the light in the Y axis direction.

When the light source 27 has a large divergence angle like a light emitting diode, it is not preferable that the condensing lens 37 be a collimating lens. The collimating lens converts light emitted from the light source 27 into parallel light. This is because when a light emitting diode is employed as the light source 27, the diameter of a light beam reaching the condensing lens 37 increases, so the parallelism of light emitted from the projection lens 6 decreases. If the decrease in the parallelism of the light is within an allowable range, a collimating lens may be employed even when the light source 27 is a light emitting diode.

The transmission element 4 may be located anywhere between the condensing lens 37 and the projection lens 6. The position of the transmission element 4 is not optically limited. Unlike the sixth embodiment, light is not scattered by the phosphor element 560. The light spread of light rays passing through the light concentration point F7 is smaller than that of scattered light.

Compared to the first embodiment, increasing the distance between the light concentration point F7 and the projection lens 6 does not affect the light use efficiency. Thus, it is possible to increase the distance from the light concentration point F7 to the projection lens 6, as compared to the case where the phosphor element 560 is disposed. When the parallelism of light rays emitted from the projection lens 6 is increased, it is preferable that the distance between the light concentration point F7 and the projection lens 6 be large.

FIGS. 23A, 23B, and 23C are diagrams illustrating results of light ray tracking when the transmission element 4 is located between the light concentration point F7 and the projection lens 6.

FIGS. 23A, 23B, and 23C are explanatory diagrams illustrating simulation results of light ray tracking in the seventh embodiment.

The transmission element 4 in FIG. 23A is perpendicular to the optical axis C.

The transmission element 4 in FIG. 23B is turned counterclockwise relative to the state of FIG. 23A as viewed from the −X axis direction side.

The transmission element 4 in FIG. 23C is turned clockwise relative to the state of FIG. 23A as viewed from the −X axis direction side.

The turning angles of the transmission element 4 in FIGS. 23B and 23C are, for example, both 30 degrees.

Paths of light after passing through the projection lens 6 in FIGS. 23A, 23B, and 23C are different from each other. Light rays 700a in FIG. 23A travel parallel to the optical axis Cp. Light rays 700b in FIG. 23B travel in the −Y axis direction obliquely to the optical axis Cp. Light rays 700c in FIG. 23C travel in the +Y axis direction obliquely to the optical axis Cp.

FIGS. 23A, 23B, and 23C illustrate the light rays 700a, 700b, and 700c emitted from a center of the light source 27. The center of the light source 27 is located on the optical axis C of the condensing lens 37. Hereinafter, light emitted from a position of the light source 27 on the optical axis C will be described.

Light emitted from the light source 27 travels in the +Z axis direction with an emission angle centered on the optical axis C.

The light traveling in the +Z axis direction is incident on the condensing lens 37.

The light incident on the condensing lens 37 is concentrated on the optical axis C.

An incident surface 41 of the transmission element 4 in FIG. 23A is perpendicular to the optical axis C. Of the light rays 700a, the light ray on the optical axis C travels without being refracted at the incident surface 41. Thus, the light rays 700a travel parallel to the optical axis C after passing through the projection lens 6. A focal point of the projection lens 6 coincides with the light concentration point F7.

The incident surface 41 of the transmission element 4 in FIG. 23B is, for example, turned counterclockwise by 30 degrees with respect to the optical axis C, as viewed from the −X axis direction side. Of the light rays 700b, the light ray on the optical axis C is refracted at the incident surface 41 in the +Y axis direction and travels. Thus, a center (the optical axis Cp) of the projection lens 6 is located on the −Y axis direction side of the light ray on the optical axis C. Thus, the light rays 700b emitted from the projection lens 6 travel in the −Y axis direction with respect to the optical axis Cp.

The incident surface 41 of the transmission element 4 in FIG. 23C is, for example, turned clockwise by 30 degrees with respect to the optical axis C, as viewed from the −X axis direction side. Of the light rays 700c, the light ray on the optical axis C is refracted at the incident surface 41 in the −Y axis direction and travels. Thus, the center (the optical axis Cp) of the projection lens 6 is located on the +Y axis direction side of the light ray on the optical axis C. Thus, the light rays 700c emitted from the projection lens 6 travel in the +Y axis direction with respect to the optical axis Cp.

When the transmission element 4 is located between the condensing lens 37 and the light concentration point F7, the headlight device 107 operates in the same manner.

With the above operation, when the incident surface 41 of the transmission element 4 is perpendicular to the optical axis C, the light rays 700a emitted from the light source 27 are emitted from the projection lens 6 as light parallel to the optical axis Cp.

When the incident surface 41 of the transmission element 4 is turned counterclockwise with respect to the optical axis C as viewed from the −X axis direction side, the light rays 700b emitted from the light source 27 are emitted from the projection lens 6 as light oblique in the −Y axis direction with respect to the optical axis Cp.

When the incident surface 41 of the transmission element 4 is turned clockwise with respect to the optical axis C as viewed from the −X axis direction side, the light rays 700c emitted from the light source 27 are emitted from the projection lens 6 as light oblique in the +Y axis direction with respect to the optical axis Cp.

The angle of light emitted from the projection lens 6 with respect to the optical axis Cp depends on the thickness or refractive index of the transmission element 4. To facilitate explanation, the transmission element 4 is described as a parallel plate.

In the above description, the light rays 700a, 700b, and 700c concentrate at the light concentration point F7. Then, the light rays 700a, 700b, and 700c are collimated into parallel light by the projection lens 6.

However, the position of the light concentration point F7, at which the light rays 700a, 700b, and 700c concentrate, may be moved. It is not mandatory that a focal position of the projection lens 6 coincide with the light concentration point F7. It is possible to reduce the distance between the light concentration point F7 and the projection lens 6, thereby causing the projection lens 6 to emit diverging light.

<Fourth Modification>

FIG. 24 is a configuration diagram schematically illustrating the main components of a fourth modification. A transmission element 4 and a projection lens 6 are the same as those of the seventh embodiment.

As illustrated in FIG. 24, a headlight device 108 includes light sources 2r, 2g, and 2b, collimating lenses 20r, 20g, and 20b, the transmission element 4, and the projection lens 6. The headlight device 108 may include a condensing lens 38 or a diffusion element 58.

The light sources 2r, 2g, and 2b are, for example, light sources that emit light of different wavelengths. For example, the light source 2r emits light in a red wavelength band. The light source 2g emits light in a green wavelength band. The light source 2b emits light in a blue wavelength band.

For example, the blue wavelength band is 430 nm to 485 nm. The green wavelength band is 500 nm to 570 nm. The red wavelength band is 600 nm to 650 nm.

The light sources 2r, 2g, and 2b are arranged in the Y axis direction. The light sources 2r, 2g, and 2b are, for example, arranged at regular intervals. In the fourth modification, the light sources 2 are arranged in 3 rows and 1 column. In FIG. 24, they are arranged in 3 rows in the Y axis direction and 1 column in the X direction. However, light sources 2 may be arranged in a matrix of 3 rows and 3 columns, e.g., 3 rows in the Y axis direction and 3 columns in the X axis direction.

An optical axis Cs of the light source 2g coincides with an optical axis C of the condensing lens 38. The light source 2r is located on the +Y axis direction side of the light source 2g. The light source 2b is located on the −Y axis direction side of the light source 2g. Optical axes Cs of the light sources 2r and 2b are parallel to the optical axis Cs of the light source 2g.

In the fourth modification, the light sources 2r, 2g, and 2b are described as laser light sources. The light sources 2r, 2g, and 2b may be light emitting diodes.

Light emitted from the light sources 2r, 2g, and 2b is collimated by the collimating lenses 20r, 20g, and 20b. The collimating lenses 20r, 20g, and 20b emit light parallel to the optical axes Cs. The optical axes Cs are optical axes of the light source 2r, 2g, and 2b.

The collimating lens 20r is located on the +Z axis direction side of the light source 2r. The collimating lens 20g is located on the +Z axis direction side of the light source 2g. The collimating lens 20b is located on the +Z axis direction side of the light source 2b.

An optical axis Ca of the collimating lens 20r coincides with the optical axis Cs of the light source 2r. An optical axis Ca of the collimating lens 20g coincides with the optical axis Cs of the light source 2g. An optical axis Ca of the collimating lens 20b coincides with the optical axis Cs of the light source 2b.

In the fourth modification, the diffusion element 58 is located at a position at which light is concentrated by the condensing lens 38. However, as described in the above seventh embodiment, the diffusion element 58 may be omitted. In the fourth modification, effects in the case of employing the diffusion element 58 are described together with effects in the case of employing the multiple light sources 2r, 2g, and 2b.

Light emitted from the collimating lenses 20r, 20g, and 20b is concentrated at the position of the diffusion element 58 by the condensing lens 38. Light emitted from the collimating lenses 20r, 20g, and 20b reaches the diffusion element 58 after passing through the transmission element 4. As in the seventh embodiment, the transmission element 4 may be between the diffusion element 58 (light concentration position), and the projection lens 6.

Light emitted from the collimating lenses 20r, 20g, and 20b is incident on the condensing lens 38 as parallel light. Thus, light emitted from the collimating lenses 20r, 20g, and 20b concentrates at a single light concentration point.

The transmission element 4 swings about an axis S2 parallel to the X axis. The transmission element 4 shifts the light concentration position of light emitted from the light sources 2r, 2g, and 2b, in the Y axis direction. However, it is also possible to swing the transmission element 4 about an axis parallel to the Y axis, thereby shifting the position at which light emitted from the light sources 2r, 2g, and 2b arrives, in the X axis direction.

In the fourth modification, light emitted from the condensing lens 38 reaches the transmission element 4. The transmission element 4 swings about the axis S2 parallel to the X axis. The transmission element 4 shifts the light concentration position on the diffusion element 58 in the Y axis direction. Due to the shift of the light concentration position, a light emitting position on the diffusion element 58 shifts. By shifting the light emitting position on the diffusion element 58, the headlight device 108 shifts the light distribution of light emitted from the projection lens 6. In the fourth modification, by shifting the light emitting position on the diffusion element 58 in the Y axis direction, the headlight device 108 shifts the light distribution of light emitted from the projection lens 6, in the Y axis direction.

When the light sources 2r, 2g, and 2b are laser light sources, the divergence angles of the light sources 2r, 2g, and 2b are small. Thus, the condensing lens 38 can be omitted. Without using the condensing lens 38, the collimating lens 20r and 20b, which are not located on the optical axis C, are made eccentric toward the optical axis C. That is, the collimating lens 20r is made eccentric in the −Y axis direction. The optical axis Ca of the collimating lens 20r is translated in the −Y axis direction. The collimating lens 20b is made eccentric in the +Y axis direction. The optical axis Ca of the collimating lens 20b is translated in the +Y axis direction. Thereby, light from the light sources 2r, 2g, and 2b may be caused to reach the diffusion element 58.

However, the use of the condensing lens 38 allows a distance in the Z axis direction to be reduced. That is, the distance from the collimating lenses 20r, 20g, and 20b to the diffusion element 58 in the Z axis direction can be reduced. This allows the headlight device 108 to be downsized.

In the fourth modification, the light sources 2r, 2g, and 2b are arranged in the Y axis direction. However, the light sources 2r, 2g, and 2b may be arranged in any manner. For example, the light sources 2r, 2g, and 2b may be located at the vertexes of an equilateral triangle centered on the optical axis C, on a plane perpendicular to the optical axis C.

For example, even if the diffusion element 58 is not provided in the headlight device 108, the effect of shifting light emitted from the projection lens 6 in the Y axis direction can be obtained. However, when three monochromatic lights are combined, color unevenness may occur in light emitted from the projection lens 6.

By disposing the diffusion element 58 between the transmission element 4 and the projection lens 6, color unevenness in light emitted from the projection lens 6 is reduced. The diffusion element 58 may be disposed between the light sources 2r, 2g, and 2b and the projection lens 6. However, it is preferable that the diffusion element 58 be disposed between the transmission element 4 and the projection lens 6. This is because the size of the light beam becomes minimum.

FIGS. 25A, 25B, and 25C are diagrams illustrating an example of light ray tracking results representing the operation of the fourth modification.

The transmission element 4 in FIG. 25A is perpendicular to the optical axis C.

The transmission element 4 in FIG. 25B is turned counterclockwise relative to the state of FIG. 25A, as viewed from the −X axis direction side.

The transmission element 4 in FIG. 25C is turned clockwise relative to the state of FIG. 25A, as viewed from the −X axis direction side.

The turning angles of the transmission element 4 in FIGS. 25B and 25C are, for example, both 30 degrees.

Paths of light after passing through the transmission element 4 in FIGS. 25A, 25B, and 25C are mutually different.

Light rays 800ar, 800ag, and 800ab in FIG. 25A are refracted at the incident surface 41 and travel. The light rays 800ar, 800ag, and 800ab concentrate at the position of the optical axis C on the diffusion element 58.

Light rays 800br, 800bg, and 800bb in FIG. 25B are refracted at the incident surface 41 in the +Y axis direction and travel. The light rays 800br, 800bg, and 800bb concentrate at a position shifted in the +Y axis direction from the position of the optical axis C on the diffusion element 58.

Light rays 800cr, 800cg, and 800cb in FIG. 25C are refracted at the incident surface 41 in the −Y axis direction and travel. The light rays 800cr, 800cg, and 800cb concentrate at a position shifted in the −Y axis direction from the position of the optical axis C on the diffusion element 58.

FIGS. 25A, 25B, and 25C illustrate the light rays 800ar, 800ag, 800ab, 800br, 800bg, 800bb, 800cr, 800cg, and 800cb emitted from centers of the light sources 2r, 2g, and 2b.

The light rays 800ar, 800br, and 800cr are light rays emitted from the light source 2r. The light rays 800ag, 800bg, and 800cg are light rays emitted from the light source 2g. The light rays 800ab, 800bb, and 800cb are light rays emitted from the light source 2b.

Light emitted from the light sources 2r, 2g, and 2b travels in the +Z axis direction with emission angles centered on the optical axes Cs of the respective light sources 2r, 2g, and 2b.

The light traveling in the +Z axis direction is collimated by the collimating lenses 20r, 20g, and 20b. The collimated light (parallel light) travels in the +Z axis direction.

The light (parallel light) traveling in the +Z axis direction is incident on the condensing lens 38.

The light (parallel light) incident on the condensing lens 38 is concentrated on the diffusion element 58.

In the case of FIG. 25A, the incident surface 41 of the transmission element 4 is perpendicular to the optical axis C. The light rays 800ar, 800ag, and 800ab are refracted at the incident surface 41. Then, the light rays 800ar, 800ag, and 800ab travel so that they concentrate on the optical axis C at the position of the diffusion element 58. Thus, the light concentration position of the light rays 800ar, 800ag, and 800ab is on the optical axis C. In FIG. 25A, the light rays 800ar, 800ag, and 800ab concentrate at the position of the optical axis C on the diffusion element 58.

In the case of FIG. 25B, the incident surface 41 of the transmission element 4 is turned counterclockwise by 30 degrees with respect to the optical axis C, as viewed from the −X axis direction side. Thus, the light concentration position of the light rays 800br, 800bg, and 800bb is shifted in the +Y axis direction with respect to the optical axis C. In FIG. 25B, the light rays 800br, 800bg, and 800bb concentrate at a position on the diffusion element 58 on the +Y axis direction side of the optical axis C.

In the case of FIG. 25C, the incident surface 41 of the transmission element 4 is turned clockwise by 30 degrees with respect to the optical axis C, as viewed from the −X axis direction side. Thus, the light concentration position of the light rays 800cr, 800cg, and 800cb is shifted in the −Y axis direction with respect to the optical axis C. In FIG. 25C, the light rays 800cr, 800cg, and 800cb concentrate at a position on the diffusion element 58 on the −Y axis direction side of the optical axis C.

With the above operation, when the incident surface 41 of the transmission element 4 is perpendicular to the optical axis C, the light rays 800ar, 800ag, and 800ab emitted from the light sources 2r, 2g, and 2b concentrate at the position of the optical axis C on the diffusion element 58.

When the incident surface 41 of the transmission element 4 is turned counterclockwise with respect to the optical axis C as viewed from the −X axis direction side, the light rays 800br, 800bg, and 800bb emitted from the light sources 2r, 2g, and 2b concentrate at a position on the diffusion element 58 on the +Y axis direction side of the optical axis C.

When the incident surface 41 of the transmission element 4 is turned clockwise with respect to the optical axis C as viewed from the −X axis direction side, the light rays 800cr, 800cg, and 800cb emitted from the light sources 2r, 2g, and 2b concentrate at a position on the diffusion element 58 on the −Y axis direction side of the optical axis C.

By swinging the transmission element 4, it is possible to shift the light concentration position on the diffusion element 58 of excitation light emitted from the condensing lens 38.

The light concentration position on the diffusion element 58 depends on the thickness or refractive index of the transmission element 4. Thus, the turning angle of the transmission element 4 is changed. To facilitate explanation, the transmission element 4 is described as a parallel plate.

In the above description, the light rays 800ar, 800ag, 800ab, 800br, 800bg, 800bb, 800cr, 800cg, and 800cb concentrate on the diffusion element 58. However, the light concentration position of the light rays 800ar, 800ag, 800ab, 800br, 800bg, 800bb, 800cr, 800cg, and 800cb need not necessarily be on the diffusion element 58. The light concentration position of the light rays 800ar, 800ag, 800ab,

800br, 800bg, 800bb, 800cr, 800cg, and 800cb may be shifted in a direction of the optical axis C with respect to the diffusion element 58.

FIG. 16 will be used as a light ray tracking diagram for explaining effects of the fourth modification. The explanation will be made by replacing the phosphor element 5 in FIG. 16 with the diffusion element 58.

The diffusion element 58 is located on the optical axis C. The diffusion element 58 is located at a position at which light emitted from the light sources 2r, 2g, and 2b concentrates. Thus, light concentrated on the region 5a, 5b, or 5c is light obtained by combining light emitted from the light sources 2r, 2g, and 2b. Thus, light emitted from the diffusion element 58 is light obtained by combining light emitted from the light sources 2r, 2g, and 2b.

The light rays 1400a emitted from the region 5a correspond to light obtained by combining the light rays 800ar, 800ag, and 800ab in FIG. 25A. Light obtained by combining the light rays 800ar, 800ag, and 800ab travels parallel to the optical axis Cp.

The light rays 1400b emitted from the region 5b correspond to light obtained by combining the light rays 800br, 800bg, and 800bb in FIG. 25B. Light obtained by combining the light rays 800br, 800bg, and 800bb travels in the −Y axis direction obliquely to the optical axis Cp after passing through the projection lens 6.

The light rays 1400c emitted from the region 5c correspond to light obtained by combining the light rays 800cr, 800cg, and 800cb in FIG. 25C. Light obtained by combining the light rays 800cr, 800cg, and 800cb travels in the +Y axis direction obliquely to the optical axis Cp after passing through the projection lens 6.

Thus, by changing the position on the diffusion element 58 of light rays emitted from the diffusion element 58, it is possible to change the direction in which the light rays travel. By shifting light emitted from the light sources 2r, 2g, and 2b on the diffusion element 58, it is possible to shift the irradiation position of light from the projection lens 6.

For example, when a driver travels in a curve, the headlight device 108 can project light emitted from the light sources 2r, 2g, and 2b in the traveling direction of the vehicle. The traveling direction of the vehicle is a direction in which the vehicle turns. This makes it possible to improve visibility for the driver with respect to the traveling direction of the vehicle.

The headlight device 108 can shift the position irradiated by light with a simple configuration. The headlight device 108 can control the light distribution.

From the above, in the fourth modification, an AFS or ADB is provided by arranging the components in the order of the light sources 2r, 2g, and 2b, collimating lenses 20r, 20g, and 20b, condensing lens 38, transmission element 4, and diffusion element 58.

Further, by changing an output value (amount of light) of each of the light sources 2r, 2g, and 2b, it is possible to change the color temperature of white light emitted from the projection lens 6. Thereby, in addition to the change in the light distribution, the color temperature can be changed.

<Fifth Modification>

Figure 26A:
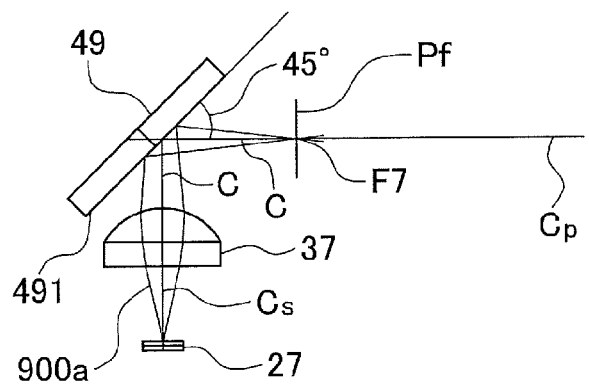
FIGS. 26A, 26B, and 26C are explanatory diagrams illustrating simulation results of light ray tracking that indicate features of a fifth modification.
Figure 26B:
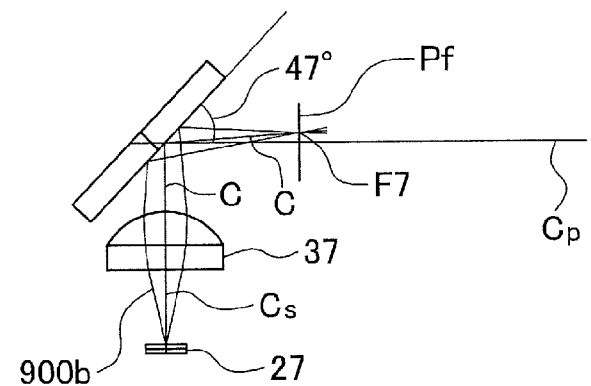
Figure 26C:
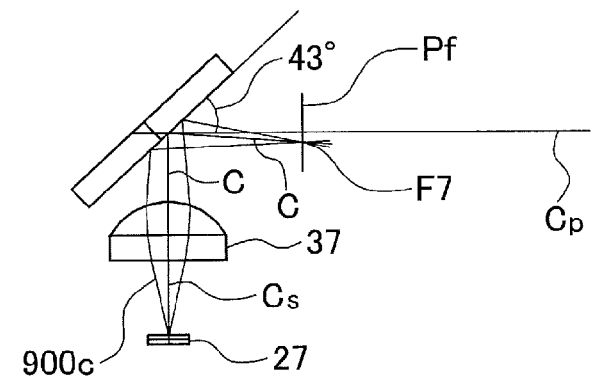
Figure 26C:
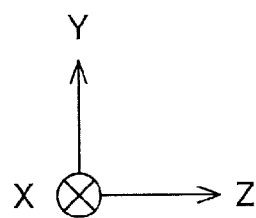

FIGS. 26A, 26B, and 26C are explanatory diagrams illustrating simulation results of light ray tracking of a headlight device 109 described in a fifth modification. In FIGS. 26A, 26B, and 26C, the projection lens 6 is omitted.

In FIG. 26A, a reflection surface 491 of a reflection element 49 is inclined at 45 degrees with respect to the optical axis C as viewed from the −X axis direction side. Thus, light reaching it from the −Y axis direction side is reflected in the +Z axis direction. This state is taken as a reference position of the reflection surface 491.

In FIG. 26B, the reflection surface 491 of the reflection element 49 is turned counterclockwise with respect to the reference position of the reflection surface 491 as viewed from the −X axis direction side. In FIG. 26B, the reflection surface 491 of the reflection element 49 is inclined at 47 degrees with respect to the optical axis C as viewed from the −X axis direction side.

In FIG. 26C, the reflection surface 491 of the reflection element 49 is turned clockwise with respect to the reference position of the reflection surface 491 as viewed from the −X axis direction side. In FIG. 26C, the reflection surface 491 of the reflection element 49 is inclined at 43 degrees with respect to the optical axis C as viewed from the −X axis direction side.

FIG. 26 illustrates FIGS. 26A, 26B, and 26C illustrate a configuration obtained by replacing the transmission element 4 in FIG. 15 with the reflection element 49. The elements other than the reflection element 49 are the same as those of the headlight device 105, and thus are given the same reference characters.

As illustrated in FIG. 22, the headlight device 107 includes the light source 27, condensing lens 37, transmission element 4, and projection lens 6.

In the fifth modification, light emitted from the light source 27 travels in the Y axis direction with an emission angle centered on the optical axis Cs. The light source 27 emits light in the +Y axis direction.

The light traveling in the +Y axis direction is converted into concentrated light by the condensing lens 37. The concentrated light travels in the +Y axis direction.

The light (concentrated light) traveling in the +Y axis direction reaches the reflection surface 491 of the reflection element 49. The light reaching the reflection surface 491 is reflected by the reflection surface 491. The light reflected by the reflection surface 491 travels in the +Z axis direction.

The light traveling in the +Z axis direction concentrates.

The concentrated light is collimated by the projection lens 6 (not illustrated). The collimated light (parallel light) travels in the +Z axis direction.

As illustrated in FIG. 26A, light emitted from the light source 27 in the +Y axis direction is concentrated by the condensing lens 37. The light concentrated by the condensing lens 37 concentrates on the optical axis Cp.

Light 900a emitted from the condensing lens 37 is reflected by the reflection surface 491 of the reflection element 49. The traveling direction of a central light ray of the light 900a reflected by the reflection surface 491 is changed by 90 degrees by the reflection surface 491. The light 900a reflected by the reflection surface 491 is concentrated on the optical axis Cp of the projection lens 6.

In FIG. 26A, the optical axis C of the condensing lens 37 is bent at 90 degrees by the reflection element 49. The following description assumes that even when the reflection element 49 is turned about the rotational axis, the optical axis C of the condensing lens 37 from the reflection element 49 to the projection lens 6 is the optical axis in the state where the optical axis C is bent at 90 degrees by the reflection element 49 (the state of FIG. 26A). That is, the description will be made on the assumption that the optical axis C of the condensing lens 37 remains in the state of FIG. 26A even when the reflection element 49 is turned. In FIGS. 26A, 26B, and 26C, the optical axis C on the projection lens 6 side of the reflection element 49 coincides with the optical axis Cp. The rotational axis of the reflection element 49 is, for example, a third axis perpendicular to the optical axis of the projection lens.

As illustrated in FIG. 26B, as viewed from the −X axis direction side, the reflection element 49 is turned counterclockwise from the reference position of the reflection surface 491. In this case, light concentrated by the condensing lens 37 concentrates on the +Y axis side of the optical axis Cp. That is, the light concentration position of light concentrated by the condensing lens 37 is shifted in the +Y axis direction from the optical axis Cp.

In FIG. 26B, an angle between the optical axis C bent at 90 degrees by the reflection element 49 and the reflection element 49 (reflection surface 491) is greater than 45 degrees. The reflection element 49 (reflection surface 491) in FIG. 26B is, for example, inclined at 47 degrees with respect to the optical axis C. Thus, the reflection element 49 (reflection surface 491) in FIG. 26B is inclined at 47 degrees with respect to the optical axis Cp.

Thus, a central light ray of a beam of light rays 900b reflected by the reflection element 49 travels in the +Z axis direction while inclined at 4 degrees in the +Y axis direction with respect to the optical axis C. The light rays 900b reflected by the reflection element 49 concentrate on the +Y axis direction side of the light concentration position in the case where the reflection surface 491 is at the reference position.

As illustrated in FIG. 26C, as viewed from the −X axis direction side, the reflection element 49 is turned clockwise from the reference position of the reflection surface 491. In this case, light concentrated by the condensing lens 37 concentrates on the −Y axis side of the optical axis Cp. That is, the light concentration position of light concentrated by the condensing lens 37 is shifted in the −Y axis direction from the optical axis Cp.

In FIG. 26C, an angle between the optical axis C bent at 90 degrees by the reflection element 49 and the reflection element 49 (reflection surface 491) is less than 45 degrees. The reflection element 49 (reflection surface 491) in FIG. 26C is, for example, inclined at 43 degrees with respect to the optical axis C. Thus, the reflection element 49 (reflection surface 491) in FIG. 26C is inclined at 43 degrees with respect to the optical axis Cp.

Thus, a central light ray of a beam of light rays 900c reflected by the reflection element 49 travels in the +Z axis direction while inclined at 4 degrees in the −Y axis direction with respect to the optical axis C. The light rays 900c reflected by the reflection element 49 concentrate on the −Y axis direction side of the light concentration position in the case where the reflection surface 491 is at the reference position.

When the reflection element 49 is used in this manner, the size of the headlight device in the Y axis direction increases. However, the size of the headlight device in the Z axis direction decreases.

When the transmission element 4 is used, the components are arranged in the Z axis direction (direction of the optical axis Cp). When the reflection element 49 is used, it is possible to arrange components off the optical axis Cp.

When the configuration of FIG. 26 is compared to the configuration of FIG. 15, the amount of shift of the light with respect to the swing angle of the transmission element 4 is less than the amount of shift of the light with respect to the swing angle of the reflection element 49. When the reflection element 49 is used, the amount of shift of the light with respect to the swing angle. Thus, for example, when it is used for a headlight intended to have a projection distance of 25 m, the accuracy of adjustment of the reflection element 49 is made higher than the accuracy of adjustment of the transmission element 4.

The projection lens 6 is not illustrated in FIGS. 26A, 26B, and 26C. The projection lens 6 is located on the +Z axis side of the light concentration position F7. However, for example, the distance between the light concentration position F7 and the projection lens 6 is 5 mm. In this case, the distance of shift of the light at a position 25 m ahead of the headlight device is 5000 times the distance of shift of the light on a plane (light concentration plane Pf) including the light concentration position F7 and being perpendicular to the optical axis Cp. This is determined from the calculation 25 m/5 mm=5000. Thus, when the light from the light source 2 is shifted by 1 mm on the light concentration plane Pf, the position 25 m ahead of the headlight device at which the light arrives is shifted by 5 m.

Thus, when the transmission element 4 is used, fine control of the light distribution is easier. Further, by changing the thickness or refractive index of the transmission element 4, it is possible to change the amount of shift with respect to the swing angle.

Further, when the reflectance (97%) of the reflection element 49 and the transmittance (99%) of the transmission element 4 are compared, the transmittance of the transmission element 4 is higher in general. Thus, when light use efficiency is considered, it is preferable to use the transmission element 4.

APPENDIXES

On the basis of the above embodiments, appendixes are described below.

Appendix 1

A headlight device comprising:
a light source that emits excitation light;
a wavelength selection portion that receives the excitation light and emits light having different color temperatures; and
a projection lens that projects the light emitted from the wavelength selection portion and having the different color temperatures, wherein:
the wavelength selection portion includes a condensing optical element and a fluorescence generation portion;
the fluorescence generation portion has regions and emits light, a color temperature of the emitted light varying depending on which of the regions receives the excitation light;
the condensing optical element concentrates the excitation light emitted from the light source; and
the concentrated excitation light reaches selectively one of the regions.

Appendix 2

The headlight device of Appendix 1, wherein:
the fluorescence generation portion includes a phosphor element that emits fluorescence;
the phosphor element includes the regions that emit light having different color temperatures; and
the condensing optical element shifts in a direction perpendicular to an optical axis of the condensing optical element, thereby causing the concentrated light to reach selectively one of the regions.

Appendix 3

The headlight device of Appendix 1, wherein:
the fluorescence generation portion includes a phosphor element that emits fluorescence;
the phosphor element includes the regions that emit light having different color temperatures; and
the condensing optical element turns about an axis perpendicular to an optical axis of the condensing optical element, thereby causing the concentrated light to reach selectively one of the regions.

Appendix 4

The headlight device of Appendix 1, wherein:
the fluorescence generation portion includes a phosphor element that emits fluorescence, and a wavelength selection element that selects wavelengths of light passing through the wavelength selection element and reflects light of wavelengths other than the selected wavelengths;
the wavelength selection element includes the regions that transmit light of different wavelengths; and
the condensing optical element shifts in a direction perpendicular to an optical axis of the condensing optical element, thereby causing the concentrated light to reach selectively one of the regions.

Appendix 5

The headlight device of Appendix 1, wherein:
the fluorescence generation portion includes a phosphor element that emits fluorescence, and a wavelength selection element that selects wavelengths of light passing through the wavelength selection element and reflects light of wavelengths other than the selected wavelengths;
the wavelength selection element includes the regions that transmit light of different wavelengths; and
the condensing optical element turns about an axis perpendicular to an optical axis of the condensing optical element, thereby causing the concentrated light to reach selectively one of the regions.

Appendix 6

The headlight device of Appendix 1, wherein:
the fluorescence generation portion includes a phosphor element that emits fluorescence;
the phosphor element includes the regions that emit light having different color temperatures; and
the phosphor element shifts in a direction perpendicular to an optical axis of the condensing optical element, thereby causing the concentrated light to reach selectively one of the regions.

Appendix 7

The headlight device of Appendix 1, wherein:
the fluorescence generation portion includes a phosphor element that emits fluorescence, and a transmission element that receives the concentrated light and emits the concentrated light toward the phosphor element;
the transmission element turns about an axis perpendicular to an optical axis of the condensing optical element;
the phosphor element includes the regions that emit light having different color temperatures; and
the transmission element turns about the axis, thereby causing the concentrated light to reach selectively one of the regions.

Appendix 8

The headlight device of Appendix 7, wherein:
the fluorescence generation portion includes a wavelength selection element that selects wavelengths of light passing through the wavelength selection element and reflects light of wavelengths other than the selected wavelengths; and
the wavelength selection element is located between the transmission element and the phosphor element.

Appendix 9

The headlight device of Appendix 1, wherein:
the fluorescence generation portion includes a phosphor element that emits fluorescence;
the phosphor element includes the regions that emit light having different color temperatures; and
the phosphor element turns about an axis parallel to an optical axis of the condensing optical element, thereby causing the concentrated light to reach selectively one of the regions.

Appendix 10

The headlight device of any one of Appendixes 2, 3, 6, and 9, wherein:
the fluorescence generation portion includes a wavelength selection element that selects wavelengths of light passing through the wavelength selection element and reflects light of wavelengths other than the selected wavelengths; and
the wavelength selection element is located between the condensing optical element and the phosphor element.

Appendix 11

The headlight device of Appendix 1, wherein:
the fluorescence generation portion includes a phosphor element that emits fluorescence, and a wavelength selection element that selects wavelengths of light passing through the wavelength selection element and reflects light of wavelengths other than the selected wavelengths;
the wavelength selection element includes the regions that transmit light of different wavelengths; and
the wavelength selection element turns about an axis parallel to an optical axis of the condensing optical element, thereby causing the concentrated light to reach selectively one of the regions.

Appendix 12

A headlight device comprising:
a light source that emits excitation light;
a condensing optical element that receives the excitation light, converts the excitation light emitted from the light source into concentrated light, and emits the concentrated light;
a transmission element that receives the concentrated light, turns about an axis perpendicular to an optical axis of the condensing optical element, and emits the concentrated light; and
a phosphor element that receives the light emitted from the transmission element and emits fluorescence, wherein:

the phosphor element includes regions that emit light having the same color temperature, and the transmission element turns about the axis, thereby causing the concentrated light to reach selectively one of the regions.

The above-described embodiments use terms, such as "parallel" or "perpendicular", indicating the positional relationships between parts or the shapes of parts. These terms include ranges taking account of manufacturing tolerances, assembly variations, or the like. Thus, when the claims include descriptions indicating the positional relationships between parts or the shapes of parts, these descriptions include ranges taking account of manufacturing tolerances, assembly variations, or the like.

Further; although the embodiments of the present invention are described as above, the present invention is not limited to these embodiments.

REFERENCE SIGNS LIST 1 headlight device
2 light source
3 condensing lens
4 transmission element
5 phosphor element
5a region of phosphor element 5
5b region of phosphor element 5
5c region of phosphor element 5
6 projection lens
C optical axis

The invention claimed is:

1. An illumination device comprising:
   at least one light source that emits light;
   a condensing optical element that concentrates the light emitted from the light source into a light concentration position;
   a projection lens that projects the concentrated light; and
   a plate-shaped transmission element that transmits the concentrated light, the transmission element being located between the condensing optical element and the projection lens, and supported rotatably about an axis perpendicular to an optical axis of the projection lens,
   wherein the light concentration position is located between the transmission element and the projection lens, and
   rotation of the plate-shaped transmission element shifts the light concentration position in a direction perpendicular to the optical axis of the projection lens.

2. The illumination device of claim 1, wherein in a direction of the optical axis, the light concentration position coincides with a focal point of the projection lens.

3. The illumination device of claim 1, further comprising a collimating lens that converts the light emitted from the light source into parallel light, wherein
   the at least one light source comprises a plurality of the light sources,
   the collimating lens emits a plurality of parallel lights corresponding to the light sources, the plurality of parallel lights being parallel to each other, and
   the condensing optical element concentrates the lights emitted from the collimating lens.

4. A headlight device comprising a housing configured to be attached to a vehicle, and the illumination device of claim 1.

5. The illumination device of claim 1, further comprising a diffusion element that diffuses the concentrated light to produce diffused light,
   wherein the diffused light is incident on the projection lens.

6. The illumination device of claim 5, wherein in a direction of the optical axis, the diffusion element is located at a focal point of the projection lens.

7. The illumination device of claim 1, further comprising a phosphor element that receives, as excitation light, the light emitted from the light source and emits fluorescence,
   wherein a position at which the concentrated light reaches the phosphor element shifts due to shift of the light concentration position.

8. The illumination device of claim 7, wherein the phosphor element includes a plurality of first regions that emit light having different color temperatures, and
   wherein the concentrated light reaching the phosphor element reaches the first regions due to shift of the light concentration position.

9. The illumination device of claim 7, further comprising a wavelength selection element that selects wavelengths of light passing through the wavelength selection element and reflects light of wavelengths other than the selected wavelengths,
   wherein the wavelength selection element is located between the condensing optical element and the phosphor element.

10. The illumination device of claim 9, wherein the wavelength selection element includes a plurality of second regions that transmit light of different wavelengths.

* * * * *